(12) United States Patent
Kawakami et al.

(10) Patent No.: US 10,732,508 B2
(45) Date of Patent: Aug. 4, 2020

(54) COATING AND DEVELOPING METHOD AND COATING AND DEVELOPING APPARATUS

(71) Applicant: Tokyo Electron Limited, Tokyo (JP)

(72) Inventors: Shinichiro Kawakami, Koshi (JP); Hiroshi Mizunoura, Koshi (JP)

(73) Assignee: Tokyo Electron Limited, Minato-ku (JP)

( * ) Notice: Subject to any disclaimer, the term of this patent is extended or adjusted under 35 U.S.C. 154(b) by 0 days.

(21) Appl. No.: 16/504,448

(22) Filed: Jul. 8, 2019

(65) Prior Publication Data

US 2019/0332013 A1  Oct. 31, 2019

Related U.S. Application Data

(62) Division of application No. 15/712,248, filed on Sep. 22, 2017, now Pat. No. 10,394,125.

(30) Foreign Application Priority Data

Sep. 23, 2016  (JP) .................................. 2016-185705

(51) Int. Cl.
*G03F 7/26* (2006.01)
*G03F 7/30* (2006.01)
(Continued)

(52) U.S. Cl.
CPC .......... *G03F 7/3057* (2013.01); *B05D 1/005* (2013.01); *B05D 1/32* (2013.01); *B05D 1/322* (2013.01);
(Continued)

(58) Field of Classification Search
CPC ........ G03F 7/3021; G03F 7/3057; G03F 7/11; G03F 7/32; G03F 7/38; G03F 7/70991;
(Continued)

(56) References Cited

U.S. PATENT DOCUMENTS 5,689,749 A * 11/1997 Tanaka .................. G03F 7/3021
396/611
5,871,584 A *  2/1999 Tateyama .............. G03F 7/3021
118/323

(Continued)

FOREIGN PATENT DOCUMENTS

| JP | 2010186774 A | * | 8/2010 |
| JP | 2013-062436 A1 | | 4/2013 |
| JP | 2014-045171 A1 | | 3/2014 |

OTHER PUBLICATIONS

Machine translation of JP 2010-186774 (no date).*

(Continued)

*Primary Examiner* — Amanda C. Walke
(74) *Attorney, Agent, or Firm* — Burr & Brown, PLLC

(57) ABSTRACT

A coating and developing method includes: a step that applies a resist containing a metal to a front surface of a substrate to form a resist film, and exposes the resist film; a developing step that supplies a developer to the front surface of the substrate to develop the resist film; and a step that forms, before the developing step, a first protective film on a peripheral part of the substrate on which the resist film is not formed, so as to prevent the developer from coming into contact with the peripheral part of the substrate, wherein the first protective film is formed at least on a peripheral end surface and a peripheral portion of a rear surface of the substrate in the peripheral part of the substrate.

2 Claims, 37 Drawing Sheets

US 10,732,508 B2

Page 2

(51) Int. Cl.

| | |
|---|---|
| *B05D 1/32* | (2006.01) |
| *B05D 1/00* | (2006.01) |
| *B05D 1/36* | (2006.01) |
| *G03F 7/004* | (2006.01) |
| *G03F 7/16* | (2006.01) |
| *G03F 7/11* | (2006.01) |
| *G03F 7/20* | (2006.01) |
| *G03F 7/32* | (2006.01) |
| *G03F 7/38* | (2006.01) |
| *H01L 21/027* | (2006.01) |

(52) U.S. Cl.
CPC ............ *B05D 1/36* (2013.01); *G03F 7/0043* (2013.01); *G03F 7/11* (2013.01); *G03F 7/16* (2013.01); *G03F 7/162* (2013.01); *G03F 7/168* (2013.01); *G03F 7/2002* (2013.01); *G03F 7/3021* (2013.01); *G03F 7/32* (2013.01); *G03F 7/38* (2013.01); *G03F 7/70991* (2013.01); *H01L 21/0274* (2013.01)

(58) Field of Classification Search
CPC ........ G03F 7/162; G03F 7/2002; G03F 7/168; B05D 1/32; B05D 1/322; B05D 1/36; H01L 21/0274; H01L 21/0276; H01L 21/6715; H01L 21/67017
USPC ........... 430/105, 315, 331; 118/600; 134/26; 427/421.1
See application file for complete search history.

(56) References Cited

U.S. PATENT DOCUMENTS

| | | | | |
|---|---|---|---|---|
| 6,432,199 | B1* | 8/2002 | Takekuma | ............. B05C 11/08 |
| | | | | 118/319 |
| 7,681,579 | B2* | 3/2010 | Schwartz | ................. A61B 8/12 |
| | | | | 128/898 |
| 8,851,092 | B2* | 10/2014 | Yamamoto | ............. G03F 7/168 |
| | | | | 134/198 |
| 9,214,363 | B2* | 12/2015 | Kyouda | .................... G03F 7/11 |
| 2004/0005516 | A1 | 1/2004 | Chen | |
| 2004/0180141 | A1* | 9/2004 | Kobayashi | ............ B05D 1/005 |
| | | | | 427/240 |
| 2006/0067682 | A1 | 3/2006 | Kaneyama et al. | |
| 2007/0056514 | A1* | 3/2007 | Akimoto | ........... H01L 21/67173 |
| | | | | 118/716 |
| 2007/0187037 | A1* | 8/2007 | Choi | ..................... G03F 7/3021 |
| | | | | 156/345.11 |
| 2007/0212884 | A1* | 9/2007 | Yamamoto | ................ G03F 7/11 |
| | | | | 438/694 |
| 2009/0033898 | A1* | 2/2009 | Yamamoto | ............. G03B 27/42 |
| | | | | 355/53 |
| 2009/0103960 | A1* | 4/2009 | Harumoto | ............ G03F 7/2041 |
| | | | | 399/377 |
| 2009/0202951 | A1* | 8/2009 | Yamamoto | ............. G03F 7/168 |
| | | | | 430/322 |
| 2010/0232781 | A1* | 9/2010 | Hontake | ............... G03F 7/0035 |
| | | | | 396/611 |
| 2010/0233638 | A1* | 9/2010 | Yoshida | ........... H01L 21/67109 |
| | | | | 430/325 |
| 2012/0013859 | A1* | 1/2012 | Matsuoka | ................. G03F 7/16 |
| | | | | 355/27 |
| 2013/0203189 | A1* | 8/2013 | Kaneda | ............ H01L 21/67115 |
| | | | | 438/16 |
| 2014/0038423 | A1* | 2/2014 | Iwao | ................. H01L 21/02104 |
| | | | | 438/758 |
| 2015/0159642 | A1* | 6/2015 | Sasa | .................... F04B 43/1238 |
| | | | | 137/544 |
| 2016/0026086 | A1* | 1/2016 | Fukuda | ................. G03F 7/3021 |
| | | | | 355/27 |
| 2016/0282722 | A1* | 9/2016 | Miyagi | ................... G03F 7/325 |
| 2017/0372922 | A1* | 12/2017 | Jung | ................... H01L 21/6715 |

OTHER PUBLICATIONS

U.S. Appl. No. 15/712,248.
Shinichiro Kawakami et al., "*Metal Containing Material Processing on Coater/Developer System,*" Proceedings of SPIE, Mar. 25, 2016, vol. 9779, pp. 97790H-1-97790H-6.
Japanese Office Action (Application No. 2016-185705) dated Aug. 7, 2018 (with English translation).

* cited by examiner

COATING AND DEVELOPING METHOD AND COATING AND DEVELOPING APPARATUS

CROSS REFERENCE TO RELATED APPLICATIONS

This application is a division of U.S. application Ser. No. 15/712,248, filed Sep. 22, 2017, and claims the benefit of Japanese Patent Application No. 2016-185705, filed Sep. 23, 2016, the entirety of which is incorporated herein by reference.

FIELD OF THE INVENTION

The present invention relates to a coating and developing method and a coating and developing apparatus that applies a resist containing a metal to a substrate to form a resist film, and develops the resist film having been exposed.

BACKGROUND OF THE INVENTION

In the manufacturing process of semiconductor devices, there is performed a photolithographic process including forming of a resist film by applying a resist to a front surface of a semiconductor wafer (referred to as "wafer" herebelow) as a substrate, exposing the resist film, and developing the exposed resist film to form a resist pattern. In recent years, forming of a resist film with the use of an inorganic resist containing a metal has been considered, because of a high resolution of a resist pattern that is exposed by using extreme ultraviolet (EUV), and a high etching resistance in an etching step succeeding to the photolithographic process. In addition, in order to improve the exposure sensitivity by generating a larger amount of secondary electrons upon exposure, adding a metal to an organic resist is also considered.

When a metal adheres to an unintended portion of a wafer during a manufacturing step of a semiconductor device, electric properties of the semiconductor device is severely affected. Thus, such a metal adhesion should be strictly avoided. However, when a resist film containing a metal is developed, as described above, there is a possibility that a developer containing a dissolved resist flows from a front surface of a wafer to a peripheral end surface of the wafer and a peripheral portion of a rear surface of the wafer. In this case, these portions are contaminated with the metal. When a contaminated portion of the wafer comes into contact with a wafer processing apparatus, such as an etching apparatus and/or a wafer transfer mechanism, another wafer that is to be transferred and processed after this wafer may be contaminated with the metal through the processing apparatus and the transport mechanism. Namely, cross contamination may possibly occur. Although Japanese Patent Laid-Open Publication JP2013-062436A describes a technique in which a chemical liquid is supplied to a peripheral part of a wafer so as to form an annular film, the technique cannot solve the aforementioned problem.

SUMMARY OF THE INVENTION

The object of the present invention is to provide a technique in which, when a resist film containing a metal formed on a front surface of a substrate is developed, a resist containing a metal is applied to the substrate so as to form a resist film, and when the resist film after it has been exposed is developed, adhesion of the metal to a peripheral end surface of the substrate and a peripheral portion of a rear surface of the substrate can be prevented.

In one embodiment, there is provided a coating and developing method, which includes: a step that applies a resist containing a metal to a front surface of a substrate to form a resist film, and exposes the resist film; a developing step that supplies a developer to the front surface of the substrate to develop the resist film; and a step that forms, before the developing step, a first protective film on a peripheral part of the substrate on which the resist film is not formed, so as to prevent the developer from coming into contact with the peripheral part of the substrate, wherein the first protective film is formed at least on a peripheral end surface and a peripheral portion of a rear surface of the substrate in the peripheral part of the substrate.

In another embodiment, there is provided a coating and developing method, which includes: a step that applies a resist containing a metal to a front surface of a substrate to form a resist film, and exposes the resist film; a developing step that supplies a developer to the front surface of the substrate to develop the resist film; and a step that supplies an adhesion prevention liquid for preventing adhesion of the metal, along a circumference of the substrate, to a peripheral part of the substrate on which the resist film is not formed, wherein the adhesion prevention liquid is supplied during a time period from before the developer is supplied to the peripheral part of the substrate until the developer is removed from the front surface of the substrate, wherein the adhesion prevention liquid is supplied at least to a peripheral end surface and a peripheral portion of a rear surface of the substrate in the peripheral part of the substrate.

In yet another embodiment, there is provided a coating and developing apparatus, which includes: a resist film forming module that applies a resist containing a metal to a front surface of a substrate to form a resist film; a developing module that supplies a developer to the front surface of the substrate to develop the resist film having been exposed; and a protective film forming module that forms a protective film on a peripheral part of the substrate on which the resist film is not formed, wherein the protective film prevents the developer from coming into contact with the peripheral part of the substrate, and wherein the protective film is formed at least on a peripheral end surface and a peripheral portion of a rear surface of the substrate in the peripheral part of the substrate.

In still yet another embodiment, there is provided a coating and developing apparatus, which includes: a resist film forming module that applies a resist containing a metal to a front surface of a substrate to form a resist film; a developing module that supplies a developer to the front surface of the substrate to develop the resist film having been exposed; and an adhesion prevention liquid supplying unit that supplies, during a time period from before the developer is supplied to the peripheral part of the substrate until the developer is removed from the front surface of the substrate, an adhesion prevention liquid for preventing adhesion of the metal along a circumference of the substrate to a peripheral part of the substrate on which the resist film is not formed, wherein the adhesion prevention liquid is supplied at least on a peripheral end surface and a peripheral portion of a rear surface of the substrate in the peripheral part of the substrate.

According to the some of the foregoing embodiments, the resist film is developed by supplying the developer to the front surface of the substrate, with a protective film for preventing the developer from being supplied being formed on the peripheral end surface of the substrate and the peripheral portion of the rear surface of the substrate. Thus, during the developing process, the metal contained in the resist film can be prevented from adhering to the peripheral end surface of the substrate and the peripheral portion of the rear surface of the substrate.

According to the other of the foregoing embodiments, a metal adhesion prevention liquid is supplied, during a time period from before the developer is supplied to the peripheral end surface of the substrate and the peripheral portion of the rear surface of the substrate until the developer is removed from the substrate, to the peripheral end surface of the substrate and the peripheral portion of the rear surface of the substrate. Thus, during the developing process, the metal contained in the resist film can be prevented from adhering to the peripheral end surface of the substrate and the peripheral portion of the rear surface of the substrate.

DETAILED DESCRIPTION OF THE INVENTION

First Embodiment

Figure 1:
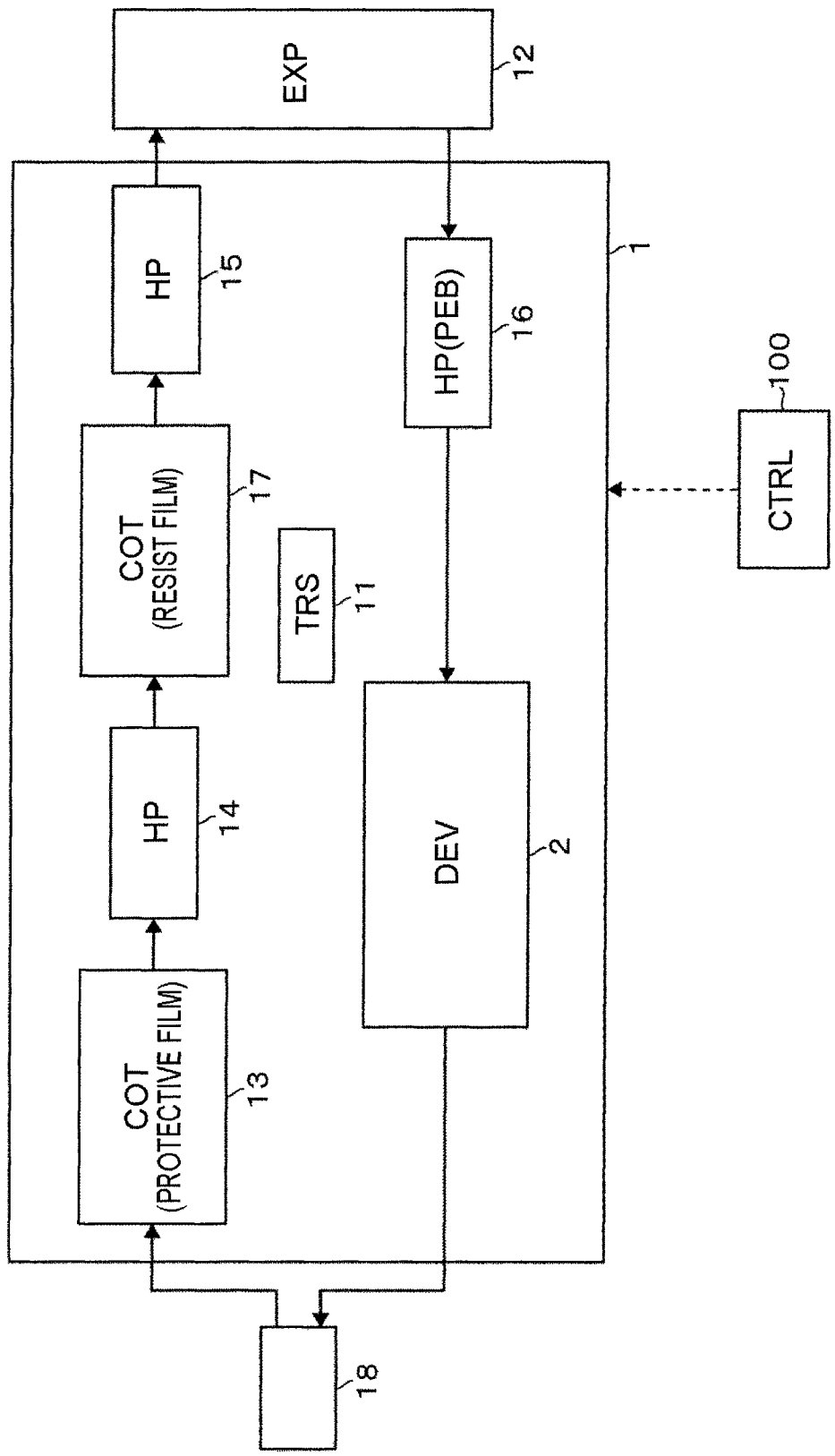
FIG. 1 is a schematic structural diagram of a coating and developing apparatus in a first embodiment of the present invention.

A coating and developing apparatus 1 according to a first embodiment of the present invention is described with reference to a schematic structural view of FIG. 1. The coating and developing apparatus 1 transfers a wafer W, which is a circular substrate having a diameter of, e.g., 300 mm, among a plurality of modules that perform various processes, by means of a transfer mechanism 11, forms a resist film by applying a resist containing a metal to a front surface of the wafer W, and develops the resist film after it has been exposed, by supplying thereto a developer. The "resist containing a metal" does not mean a resist into which a metal is mixed as impurities, but means a resist containing a metal as a main component. Exposure of the resist film is performed by an exposure apparatus 12 connected to the coating and developing apparatus 1.

In order to transfer a wafer W, the transfer mechanism 11 includes a displacement restriction unit that surrounds the wafer W from the lateral side of the wafer W to restrict the lateral position of the wafer W, and a support unit that supports a peripheral portion of a rear surface of the wafer W. The wafer W is described in more detail. The wafer W has inclined surfaces (so-called "bevel(s)") on the front side and the rear side of the wafer W. The inclined surface on the front side lowers toward the circumferential edge of the wafer W, and the inclined surface on the rear side rises toward the circumferential edge of the wafer W. The surfaces of the bevels and a vertical circumferential side surface (also referred to as "apex") of the wafer W constitute a peripheral end surface of the wafer W.

In order to prevent the metal contained in the resist from contaminating the transfer mechanism 11 through the wafer W, the resist film is formed and developed such that, in the entire circumference of the wafer W, the metal does not adhere to a peripheral area extending from a position slightly inside the bevel on the front side to a position slightly inside the bevel on the rear side through the circumferential side surface. The peripheral area, which is referred to as "metal adhesion prevention area", is described in more detail. Before application of the resist, a protective film for preventing contact with the resist is formed on the metal adhesion prevention area, by supplying thereto a chemical liquid. Namely, a resist film is formed by applying the resist to the wafer W, with the metal adhesion prevention area being covered with the protective film. The portion of the resist film formed on the protective film is removed by supplying thereto a resist solvent (a solvent capable of dissolving the resist film).

When the wafer W is placed on a stage of the exposure apparatus 12 so as to be exposed, there is a possibility that, because of the formation of the protective film, the height position of the wafer W on the stage is displaced from the correct position, so that the position of the wafer W to be exposed is displaced from the correct position. In order to prevent the displacement of the exposure position, the protective film is removed by supplying thereto a protective film removing solvent, before the exposure is performed.

Then, after the exposure and before the development, a protective film is again formed on the metal adhesion prevention area by supplying thereto a chemical liquid. The resist film is developed by supplying thereto a developer, with the metal adhesion prevention area being covered with the protective film. Thus, the metal contained in the resist dissolved in the developer can be prevented from adhering to the metal adhesion prevention area. After the development, in order to prevent that, in a succeeding step such as an etching, the position of the wafer W placed on the stage is displaced from the correct position due to the presence of the protective film, and in order to prevent that that particles are generated from the protective film, the protective film is removed by supplying thereto a protective film removing solvent. The aforementioned each protective film is made of a material that is not dissolved in the developer, which contains, e.g., a phenol-based resin, a naphthalene-based resin, a polystyrene-based resin or a benzene-based resin, as a main component.

In order to perform such processes, the coating and developing apparatus 1 includes a protective film forming module (COT (Protective Film)) 13, heating modules (HP) 14 to 16, a resist film forming module (COT (Resist Film)) 17, a developing module (DEV) 2 and a control unit (CTRL) 100, which are shown in FIG. 1. In FIG. 1, solid line arrows show a transfer route of the wafer W. The wafer W, which has been stored in a carrier 18 and transferred to the coating and developing apparatus 1, is transferred, by means of the transfer mechanism (TRS) 11, to the protective film forming module 13, the heating module 14, the resist film forming module 17, the heating module 15, the exposure apparatus (EXP) 12, the heating module 16, the developing module 2 and the carrier 18, in this order.

The protective film forming module 13 is a module that forms a protective film before formation of a resist film. The resist film forming module 17 forms a resist film, removes an unnecessary portion of the resist film, which is formed on the peripheral part of the wafer W and on the protective film, and removes the protective film. The developing module 2 forms a protective film after the resist film has been exposed, develops the resist film, and removes the protective film after the development.

The heating modules 14 to 16 respectively include a heat plate on which the wafer W is placed and heated. The heating module 14 heats the wafer W on which a protective film has been formed, so as to evaporate a medium forming a chemical liquid for forming the protective film, which remains in the protective film. The heating module 15 heats the wafer W after a resist film has been formed thereon and before it is exposed, so as to evaporate a solvent remaining in the resist film. The heating module 16 heats the exposed wafer W so as to remove standing wave effects generated in the resist film during the exposure. Namely, the heating module 16 performs a so-called post exposure baking (PEB).

Figure 2:
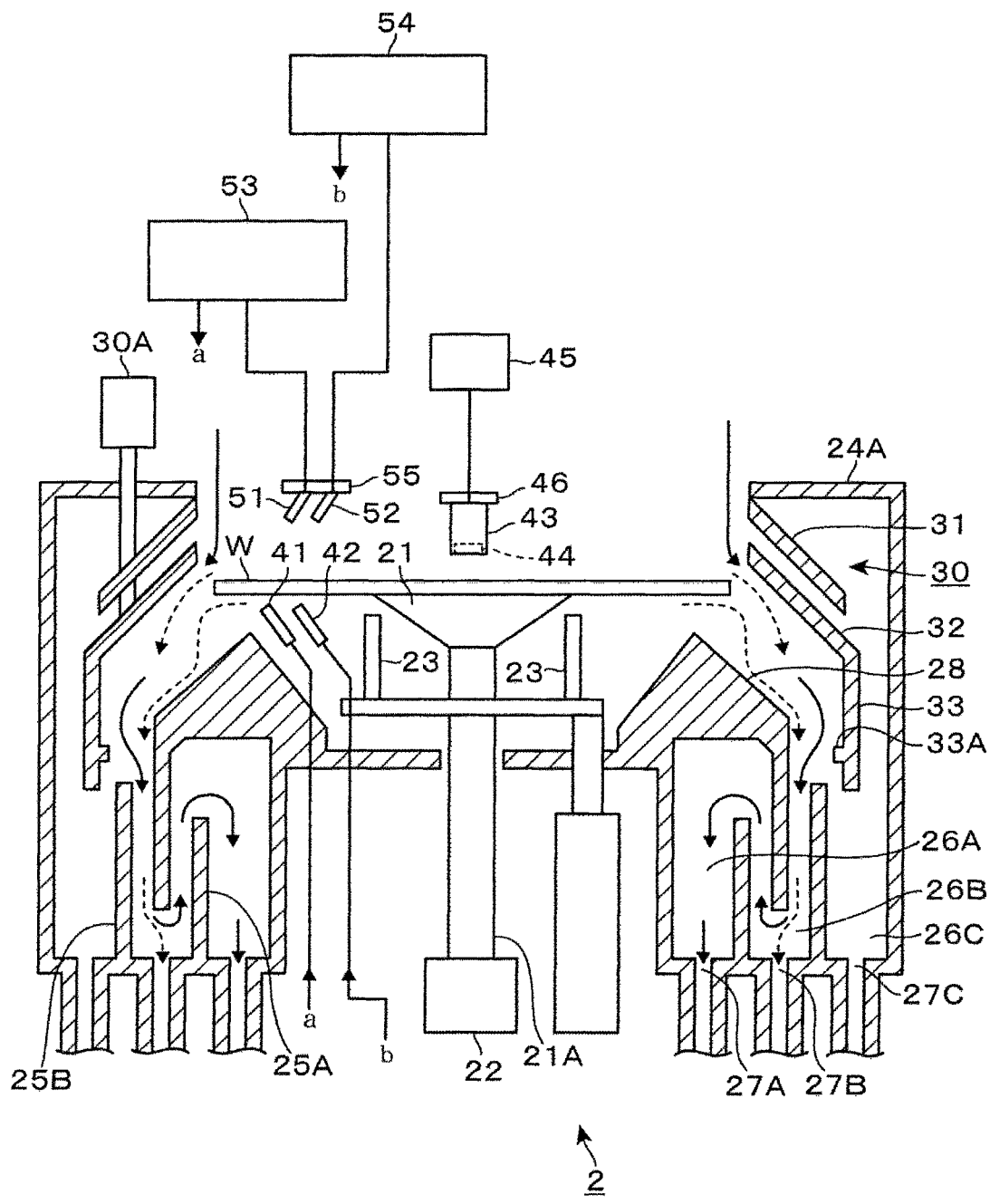
FIG. 2 is a vertical sectional view of a developing module provided in the coating and developing apparatus.
Figure 3:
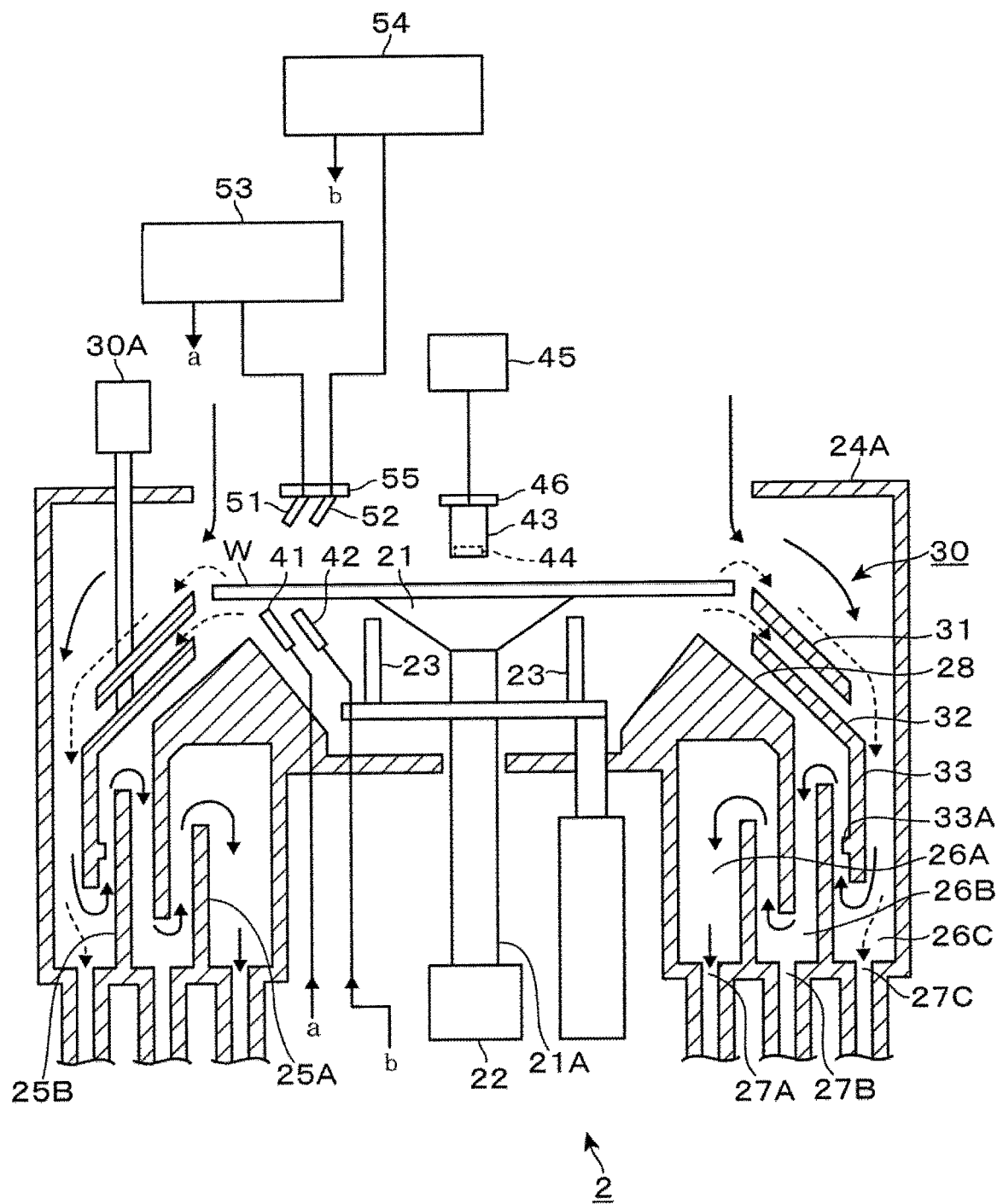
FIG. 3 is a vertical sectional view of the developing module provided in the coating and developing apparatus.
Figure 4:
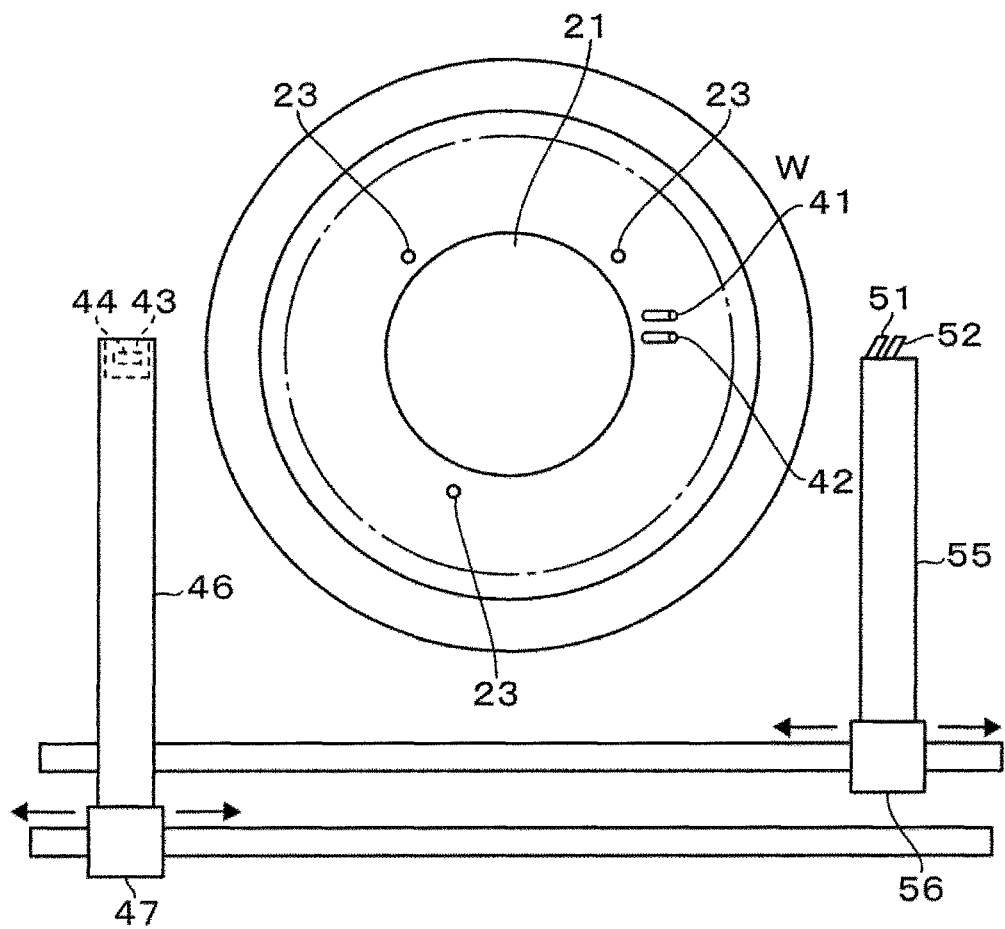
FIG. 4 is a plan view of the developing module.

The developing module 2 is described in more detail with reference to FIGS. 2 and 3 which are vertical sectional views, and FIG. 4 which is a plan view. FIGS. 2 and 3 show that a vertically movable cup 30 described later is located at an elevated position and at a lowered position, respectively. The reference numeral 21 depicts a spin chuck that absorbs a central part of the rear surface of the wafer W such that the wafer W is held horizontally. The spin chuck 21 is connected to a rotation mechanism 22 through a vertical shaft part 21A. The rotation mechanism 22 rotates the spin chuck 21 about a vertical axis. The reference numeral 23 depicts three elevatable support pins which support the rear surface of the wafer W, and transfer the wafer W between the transfer mechanism 11 and the spin chuck 21.

The reference numeral 24 depicts a circular cup that is disposed to surround a lateral side of the wafer W held by the spin chuck 21. An upper end part of the cup 24 projects inward so as to form a projecting part 24A. On a bottom wall of the cup 24, standing partition walls 25A and 25B are provided in this order to the outside of the cup 24. The partition walls 25A and 25B are concentric in a plan view. Three annular recesses 26A, 26B and 26C are concentrically formed in this order to the outside of the cup 24, by the partition walls 25A and 25B and a sidewall of the cup 24. The recesses 26A, 26B and 26C have an exhaust port 27A, a drainage port 27B and a drainage port 27C, respectively.

An annular ring plate 28 is disposed horizontally above the partition wall 25A, with the shaft part 21A passing therethrough. In order to guide a liquid spilt from the wafer W toward a circumferential edge part of the ring plate 28, the ring plate 28 has a chevron shape in a vertical sectional view, with the top thereof being positioned below the wafer W. The circumferential edge part of the ring plate 28 is drawn downward to enter into the recess 26B. A chemical nozzle 41 for lower protective film formation that discharges a chemical liquid for protective film formation, and a lower solvent nozzle 42 for protective film removal that discharges a protective film removing solvent are provided above the ring plate 28. As shown in FIG. 4, for example, the nozzles 41 and 42 are located circumferentially close to each other. However, in order to show both the nozzles 41 and 42, FIG. 2 shows that the nozzles 41 and 42 are located close to each other in the radial direction of the wafer W. These lower chemical nozzle 41 for protective film formation and the lower solvent nozzle 42 for protective film removal respectively discharge a chemical liquid and a solvent diagonally upward from the inside to the outside of the wafer W.

The reference numeral 43 depicts a developer nozzle which discharges a developer vertically downward from a slit-like discharge port 44. The reference numeral 45 depicts a developer supply source which supplies a developer stored therein to the developer nozzle 43. The reference numeral 46 depicts an arm which supports at the distal end thereof the developer nozzle 43. A proximal end of the arm 46 is connected to a drive mechanism 47 that horizontally and vertically moves the arm 46. The developer nozzle 43 is disposed on the arm 46 such that, by means of the drive mechanism 47, the developer nozzle 43 is moved along the longitudinal direction of the discharge port 44, and that the position at which the developer falls on the front surface of the wafer W moves along the diameter of the wafer W. In addition, the developer nozzle 43 can be moved between the inside and the outside of the cup 24 by the drive mechanism 47.

The reference numeral 51 depicts an upper chemical nozzle for protective film formation which discharges a chemical liquid for protective film formation diagonally downward from the inside of the wafer W to the outside thereof. The reference numeral 52 depicts an upper solvent nozzle for protective film removal which discharges a protective film removing solvent diagonally downward from the inside of the wafer W to the outside thereof. The reference numeral 53 depicts a supply source of a chemical liquid for protective film formation, which supplies a chemical liquid stored therein to the upper chemical nozzle 51 for protective film formation and the lower chemical nozzle 41 for protective film formation respectively. The reference numeral 54 depicts a supply source of a protective film removing solvent, which supplies a solvent stored therein to the upper solvent nozzle 52 for protective film removal and the lower solvent nozzle 42 for protective film removal, respectively. The reference numeral 55 depicts an arm which supports at its distal end the upper chemical nozzle 51 for protective film formation and the upper solvent nozzle 52 for protective film removal. The proximal end of the arm 55 is connected to a drive mechanism 56 that horizontally and vertically moves the arm 55. The respective nozzles 51 and 52 can be moved between the inside and the outside of the cup 24 by the drive mechanism 56.

The developer, the chemical liquid for protective film formation and the protective film removing solvent, which are used in the first embodiment, include an organic medium. In addition to these chemical liquids, other embodiments described later use a process liquid for liquid film formation which is an organic medium, SC2 which is a mixture liquid of hydrochloric acid, hydrogen peroxide solution and water, SPM which is a mixture liquid of sulfuric acid, hydrogen peroxide solution and water, and deionized water. SC2 and SPM are inorganic media. For the purpose that a waste liquid of an organic medium and a waste liquid of an inorganic medium are discharged outside the cup 24 in such a manner that they are not mixed with each other, drainage paths into which a waste liquid enters are switched depending on a position of the movable cup 30. Thus, in the first embodiment, the position of the movable cup 30 is fixed during a process the wafer W. On the other hand, in the other embodiments described later, the position of the movable cup 30 is moved in accordance with a liquid to be supplied to the wafer W. When the organic medium is supplied to the wafer W, the movable cup 30 is located at the elevated position shown in FIG. 2. On the other hand, when the inorganic medium and water are supplied to the wafer W, the movable cup is located at the lowered position shown in FIG. 3.

The movable cup 30 is composed of an upper inclined ring plate 31 and a lower inclined ring plate 32 each having a circular shape in a plan view, which are superposed with a vertical interval therebetween, so as to surround a wafer W placed on the spin chuck 21. Each of the upper inclined ring plate 31 and the lower inclined ring plate 32 are inclined such that the diameter thereof decreases as it moves upward. The lower inclined ring plate 32 is oriented downward and bent, and the lower end part thereof forms a cylindrical part 33 that extends in the vertical direction. A ring-like projection 33A is provided on an inner circumferential surface of the cylindrical part 33 to extend along the circumferential direction. The reference numeral 30A depicts an elevation mechanism that vertically moves the upper inclined ring plate 31 and the lower inclined ring plate 32 between the elevated position and the lowered position.

As shown in FIG. 2, when the movable cup 30 is located at the elevated position, an upper end of the upper inclined ring plate 31 and the projecting part 24A of the cup 24 come close to each other, and the lower surface of an inner circumferential part of the lower inclined ring plate 32 is located above the front surface of the wafer W, whereby a process liquid scattered from the wafer W can be received. In addition, the projection 33A of the cylindrical part 33 is located above the partition wall 25B. As shown in FIG. 3, when the movable cup 30 is located at the lowered position, the cylindrical part 33 is located inside the recess 26C, and the projection 33A is located close to an outer circumferential surface of the partition wall 25B. In addition, the upper end of the upper inclined ring plate 31 is located at the same or substantially the same height as the front surface of the wafer W.

An air supply unit, not shown, is disposed above the cup 24, which supplies air downward. For example, throughout the operation of the developing module 2, the air supply and the discharge of air from the exhaust port 27A of the cup 24 are continuously carried out. The air, which is supplied from the air supply unit forms downward airflow toward the cup 24, is discharged from the exhaust port 27A. In FIGS. 2 and 3, the solid arrows show a main flow of air in the cup 24.

When the movable cup 30 is located at the elevated position, air supplied from above the cup 24 onto the front surface of the wafer W flows to a relatively large space defined between the ring plate 28 and the lower surface of the lower inclined ring plate 32, and is guided by the projection 33A to between the outer circumferential surface of the ring plate 28 and the inner circumferential surface of the partition wall 25A so as to be introduced into the recess 26B. On the other hand, the air is prevented from flowing into the recess 26C outside the recess 26B. The air having flown into the recess 26B flows across the partition wall 25A into the exhaust port 27A of the recess 26A so as to be discharged therefrom. When the movable cup 30 is located at the lowered position, air supplied from above the cup 24 onto the front surface of the wafer W flows to a relatively large space defined between the projecting part 24A and the upper surface of the upper inclined ring plate 31 to pass through between the outer circumferential surface of the cylindrical part 33 of the lower inclined ring plate 32 and the inner circumferential surface of the sidewall of the cup 24 so as to flow into the recess 26C. Then, the air flows across the partition walls 25B and 25A sequentially to flow into the exhaust port 27A so as to be discharged therefrom.

When the movable cup 30 is located at the elevated position, each liquid scattered from the wafer W is guided to a drainage port 37B of the recess 36B. In FIG. 2, dotted-line arrows show the liquid flow in the cup 24. To be more specific, since the movable cup 30 is located at the elevated position, the liquid scatters between the ring plate 28 and the lower surface of the lower inclined ring plate 32. The liquid is swept by the above-described air flow to be introduced to the recess 26B, and is then discharged from the drainage port 27B to the outside of the cup 24.

When the movable cup 30 is located at the lowered position, each liquid scattered from the wafer W is guided to the drainage port 27C of the recess 26C. In FIG. 3, dotted-line arrows show the liquid flow in the cup 24. To be more specific, since the movable cup 30 is located at the lowered position, the liquid scatters between the projecting part 24A and the cup 24 and the upper surface of the upper inclined ring plate 31, and between the lower inclined ring plate 32 and the upper inclined ring plate 31, so as to be introduced between the inner circumferential surface of the sidewall of the cup 24 and the outer circumferential surface of the cylindrical part 33. Then, the liquid is swept by the above-described air flow to be introduced to the recess 26C, and is then discharged from the drainage port 27C to the outside of the cup 24.

Figure 5:
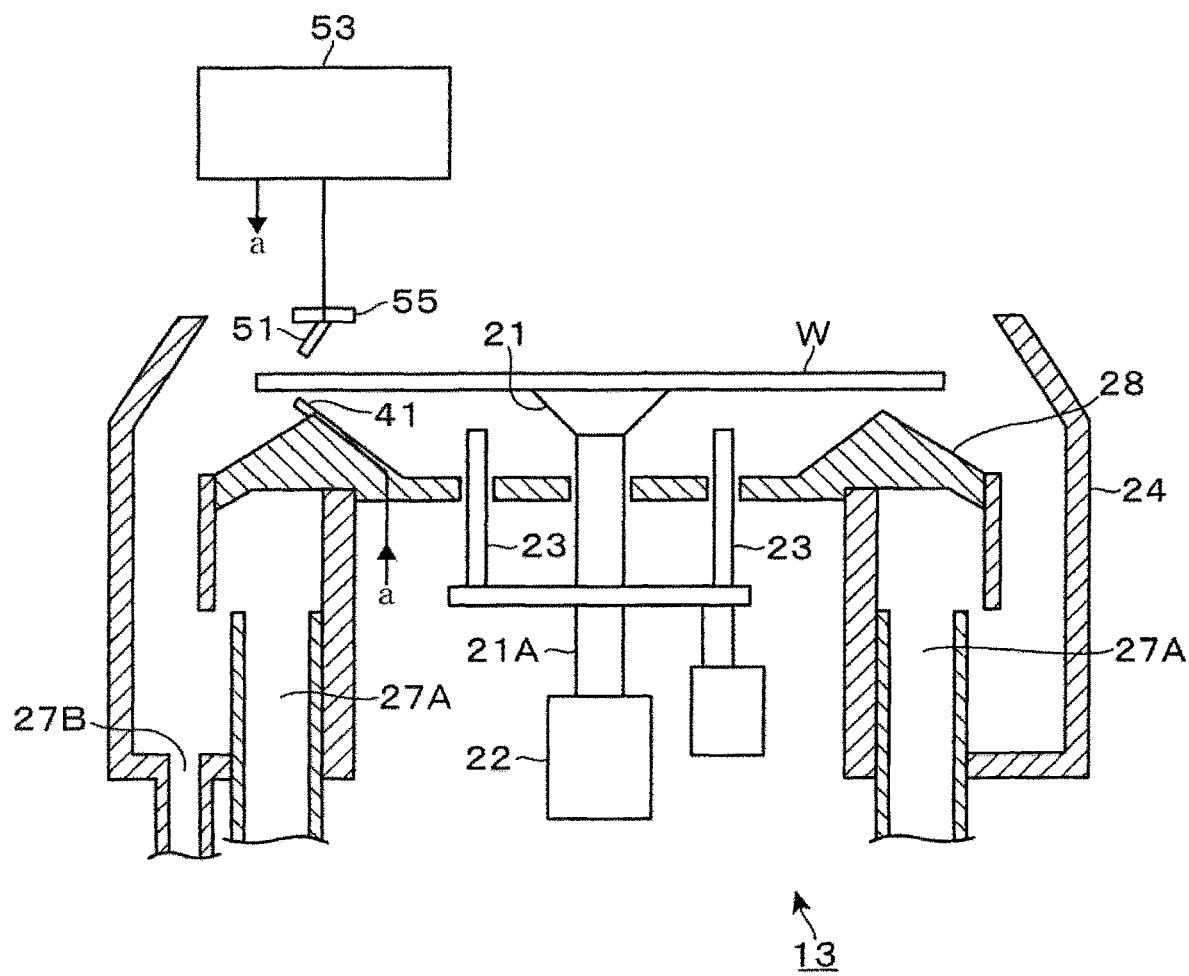
FIG. 5 is a vertical sectional view of a protective film forming module provided in the coating and developing apparatus.

Next, the protective film forming module 13 is described with reference to FIG. 5 that is a vertical sectional view. In FIG. 5, a component having the structure as that of the developing module 2 is shown by the same reference numeral as those used in the description of the developing module 2. The protective film forming module 13 differs from the developing module 2 in that the former is not equipped with the movable cup 30, the developer nozzle 43, the upper solvent nozzle 52 for protective film removal and the lower solvent nozzle 42 for protective film removal. Other than these differences, the protective film forming module 13 has a similar structure to that of the developing module 2.

Following thereto, the resist film forming module 17 is described with reference to FIG. 6 that is a vertical sectional view. Also in FIG. 6, a component having the structure as that of the developing module 2 is shown by the same reference numeral as those used in the description of the developing module 2. An arm 46 of the resist film forming module 17 is equipped with, in place of the developer nozzle 43, a resist nozzle 61 that discharges a resist vertically downward. The reference numeral 62 depicts a resist supply source which stores the aforementioned resist containing a metal and supplies the resist to the resist nozzle 61.

In place of the lower chemical nozzle 41 for protective film formation, there is provided a lower solvent nozzle 49 for resist film removal that discharges a resist solvent. Similar to the lower chemical nozzle 41 for protective film formation, the lower solvent nozzle 49 for resist film removal discharges a liquid onto the peripheral portion of the rear surface of the wafer W from the inside to the outside. Further, the arm 55 is equipped with, in place of the upper chemical nozzle 51 for protective film formation, an upper solvent nozzle 59 for resist film removal. Similar to the upper chemical nozzle 51 for protective film formation, the upper solvent nozzle 59 for resist film removal discharges a liquid onto the peripheral part of the front surface of the wafer W from the inside to the outside. The reference numeral 48 depicts a resist solvent supply source which supplies a solvent stored therein to the lower solvent nozzle 49 for resist film removal and the upper solvent nozzle 59 for resist film removal, respectively. Other than these differences, the resist film forming module 17 has the similar structure to that of the developing module 2.

Returning to FIG. 1, the control unit 100 is described. The control unit 100 is formed of a computer, and has a program storage unit, not shown. The program storage unit stores a program including instructions (step groups) such that a wafer W can be processed in each module and that the wafer W can be transferred among the modules. Operations of the units/devices of the coating and developing apparatus 1 are controlled by the control unit 100 which outputs control signals to the units/devices of the coating and developing apparatus 1 based on the program. The program is stored in the program storage unit in a state of being stored in a memory medium such as a hard disc, a compact disc, a magneto-optical disc or a memory card.

Figure 7:
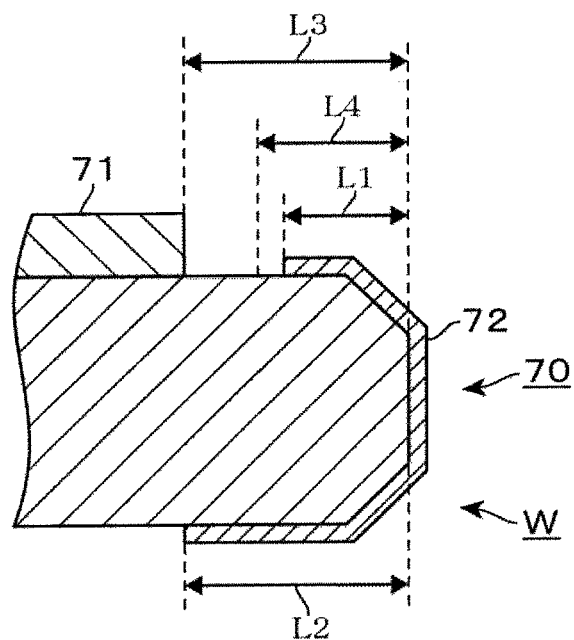
FIG. 7 is a vertical sectional view of a peripheral part of a wafer.

An example of the metal adhesion prevention area covered with the protective film is described with reference to FIG. 7 that is a vertical sectional view of the peripheral part of the wafer W. In FIG. 7, the metal adhesion prevention area is indicated by the reference numeral 70. The reference number 71 depicts a resist film from which an unnecessary portion covering the peripheral part of the wafer W is removed by a solvent. The reference numeral 72 depicts a protective film formed in the developing module 2 and the protective film forming module 13. In the front surface of the wafer W, the distance L1 between the circumferential side surface of the wafer W and the end of the metal adhesion prevention area 70 on the wafer center side is 0.2 mm to 0.8 mm, for example. In the rear surface of the wafer W, the distance L2 between the circumferential side surface of the wafer W and the end of the metal adhesion prevention area 70 on the wafer center side is 2.0 mm, for example. The distance L3 between the circumferential edge of the resist film 71 and the circumferential side surface of the wafer W is 1.35 mm to 1.65 mm, for example. The reference numeral L4 depicts the distance between the circumferential side surface of the wafer W and the end (on the wafer W center side) of the area to which the protective film removing solvent is supplied, which is 0.85 mm to 1.15 mm, for example.

In order to avoid the situation where the protective film removing solvent is supplied to the resist film 71 so that the resist film 71 is altered, the distance L3 is larger than the distance L4 (L3>L4). In addition, as described above, since the transfer mechanism 11 transfers the wafer W in such a manner that it contacts with the peripheral end surface of the wafer W and the peripheral portion of the rear surface of the wafer W, the distance L1 can be set relatively smaller. Thus, the distance L1 is smaller than the distance L2 (L1<L2). Since the distance L1 is set smaller so as not to increase the distance L4, whereby it can be more reliably prevented that the protective film forming solvent is supplied to the resist film 71.

Figure 8:
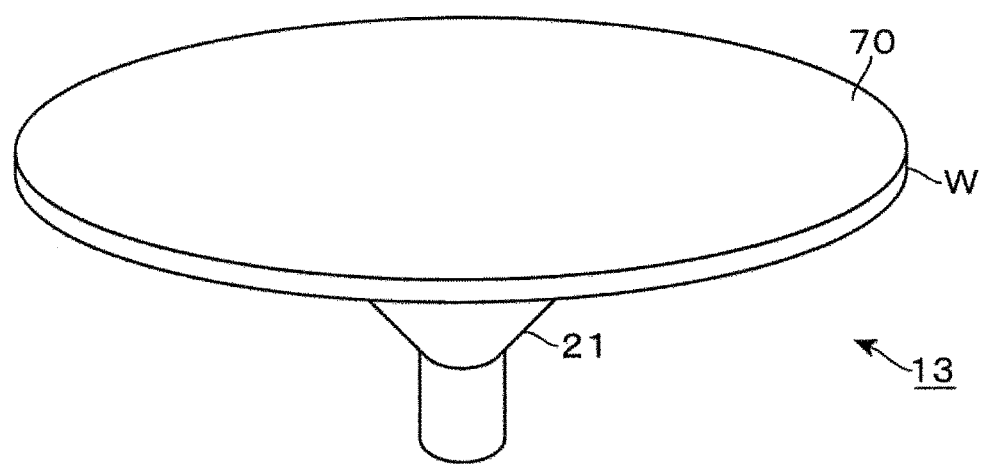
FIG. 8 is a perspective view showing a process step of placing the wafer on a spin chuck.
Figure 9:
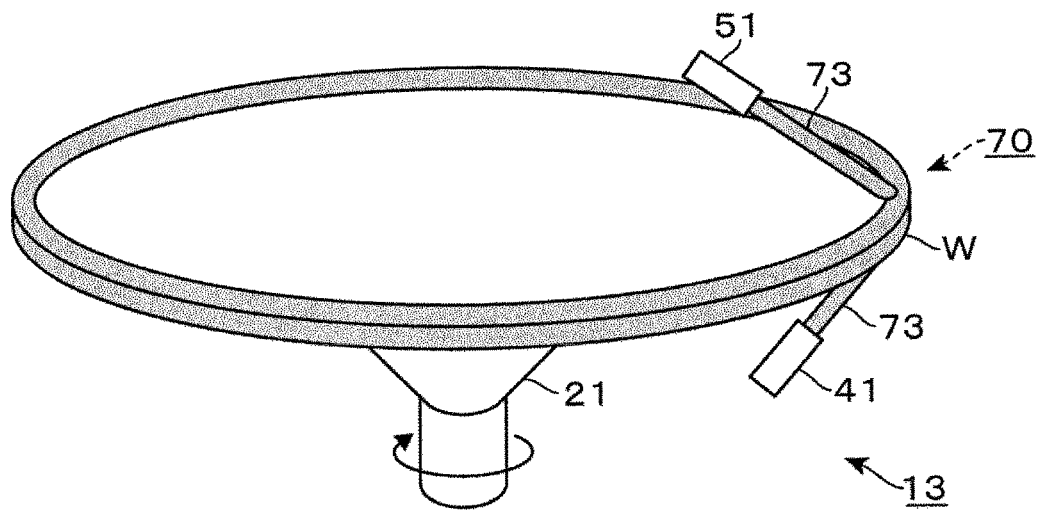
FIG. 9 is a perspective view showing a process step of forming a protective film.
Figure 15:
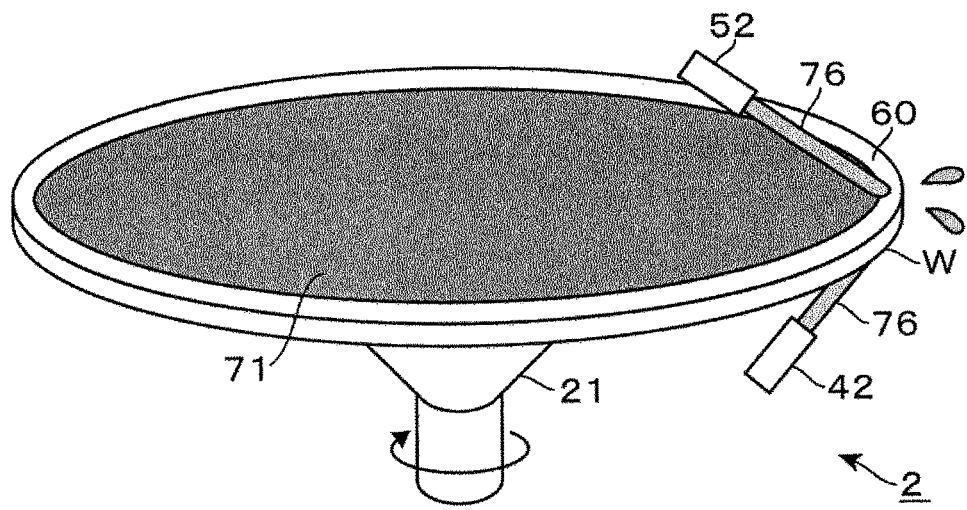
FIG. 15 is a perspective view showing a process step of removing the protective film.
Figure 16:
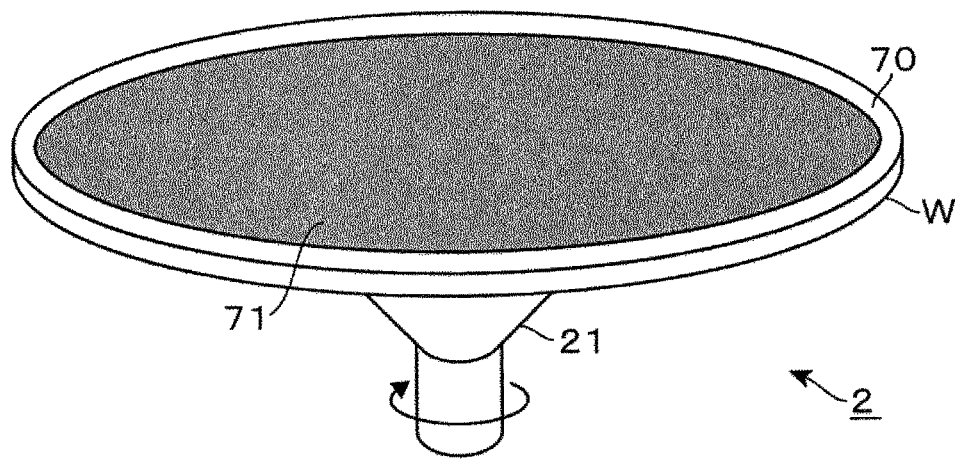
FIG. 16 is a perspective view showing the end of the process steps.
Figure 17:
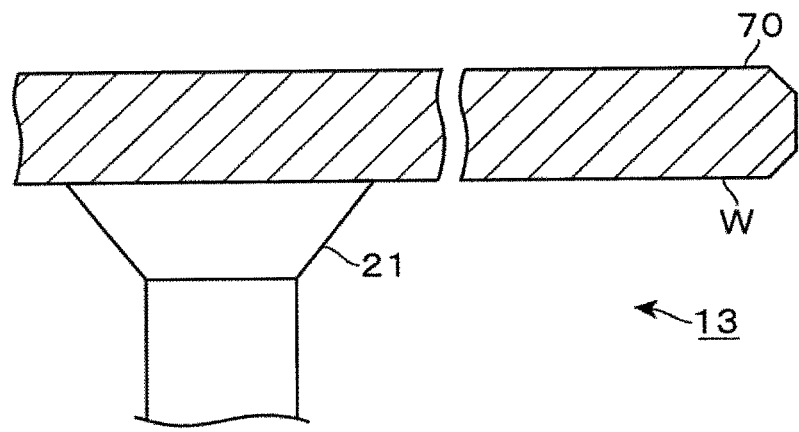
FIG. 17 is a vertical sectional view showing the process step of placing the wafer on the spin chuck.
Figure 18:
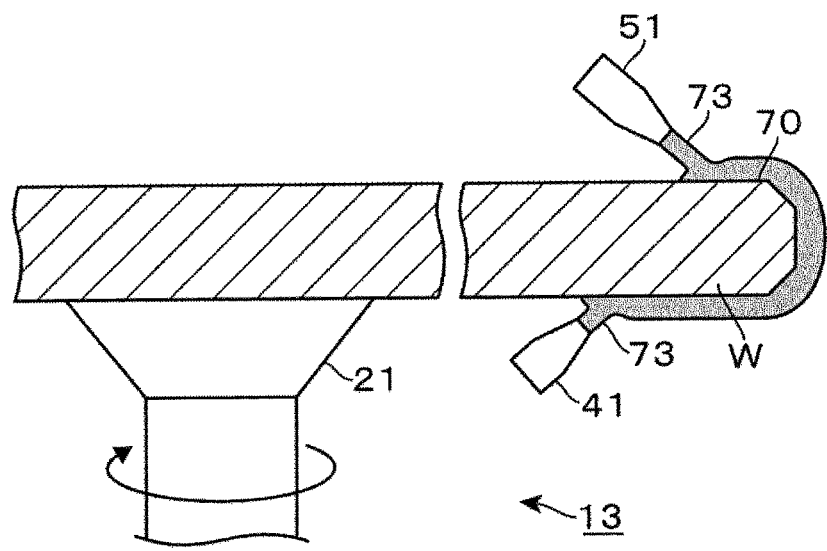
FIG. 18 is a vertical sectional view showing the process step of forming the protective film.

Next, a process of the wafer W performed by the coating and developing apparatus 1 is described with reference to FIGS. 8 to 16 that are perspective view of the wafer W and FIGS. 17 to 25 that are vertical sectional views of the wafer W. The wafer W transferred from the carrier 18 is placed on the spin chuck 21 of the protective film forming module 13 (FIGS. 8 and 17). While wafer W is rotated, the chemical liquid 73 is supplied from the upper chemical nozzle 51 for protective film formation to the peripheral portion of the front surface of the wafer W, and the chemical liquid 73 is supplied from the lower chemical nozzle 41 for protective film formation to the peripheral portion of the rear surface of the wafer W. Due to the fact that the chemical liquid 73 is discharged from the nozzles 51 and 41 to the outside of the wafer W and the centrifugal force of the rotation of the wafer W, the chemical liquids 73 supplied to the front surface and the the rear surface of the wafer W flow toward the circumferential side surface of the wafer W to merge on the circumferential side surface, so that the metal adhesion prevention area 70 is covered with the chemical liquid 73 (FIGS. 9 and 18). Then, the discharging of the chemical liquid 73 from the upper chemical nozzle 51 for protective film formation and the lower chemical nozzle 41 for protective film formation is stopped. The chemical liquid 73 supplied to the wafer W is exposed to an air flow caused by the rotation of the wafer W and evacuation of the cup 24. Thus, an organic medium contained in the chemical liquid 73 evaporates and the chemical liquid 73 dries, so that a protective film 72 as a second protective film is formed from the chemical liquid 73.

Figure 10:
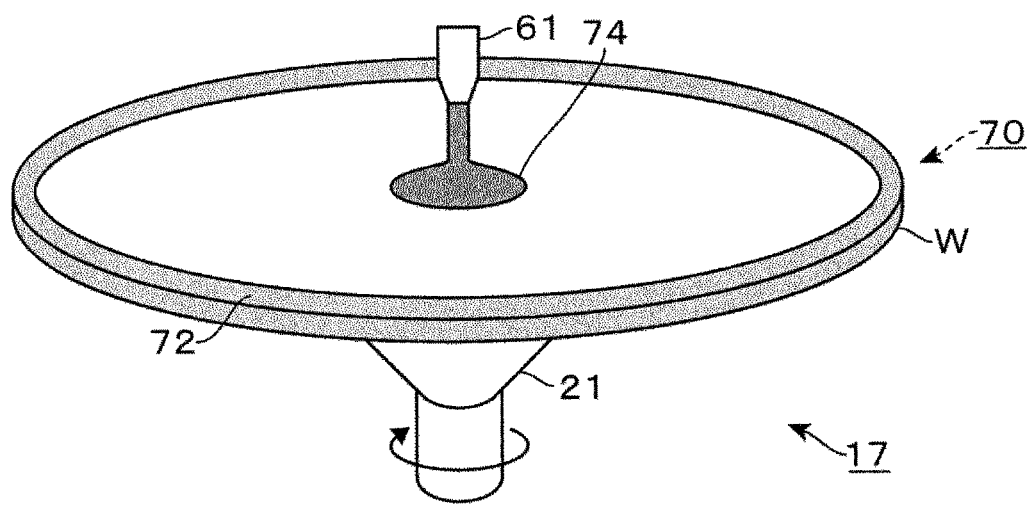
FIG. 10 is a perspective view showing a process step of forming a resist film.
Figure 19:
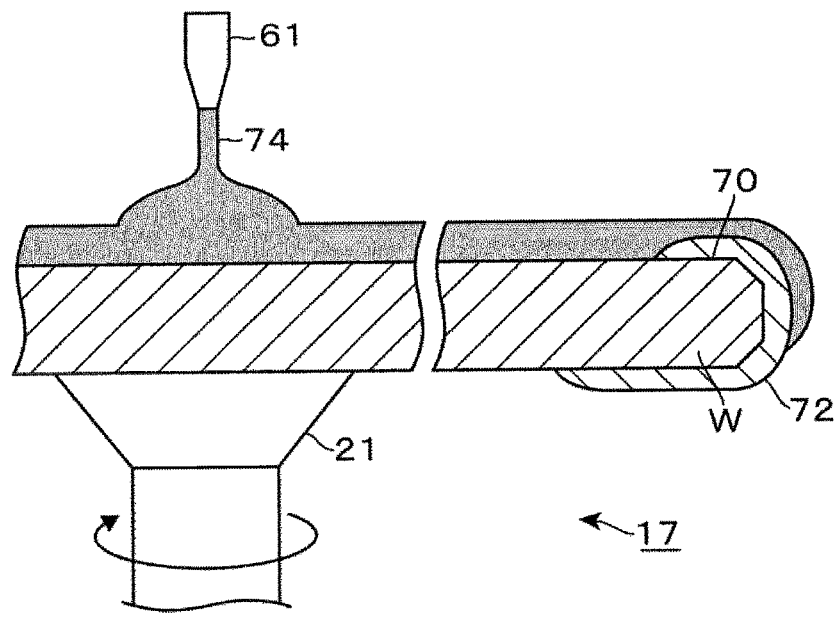
FIG. 19 is a perspective view showing the process step of forming the resist film.

Thereafter, the rotation of the wafer W is stopped. The wafer W is transferred to the heating module 14 and heated, whereby the organic medium remaining in the protective film 72 evaporates. After that, the wafer W is transferred to the resist film forming module 17, placed on the spin chuck 21, and rotated. A resist 74 is discharged from the resist nozzle 61 to the central part of the wafer W (FIG. 10). Due to the centrifugal force of the rotation of the wafer W, the resist 74 is extended toward the peripheral part of the wafer W so that the front surface of the wafer W is covered with the resist 74 as a whole (FIG. 19). Then, the discharging of the resist 74 from the resist nozzle 61 is stopped. The resist 74 on the front surface of the wafer W dries so that the resist film 71 is formed.

Figure 11:
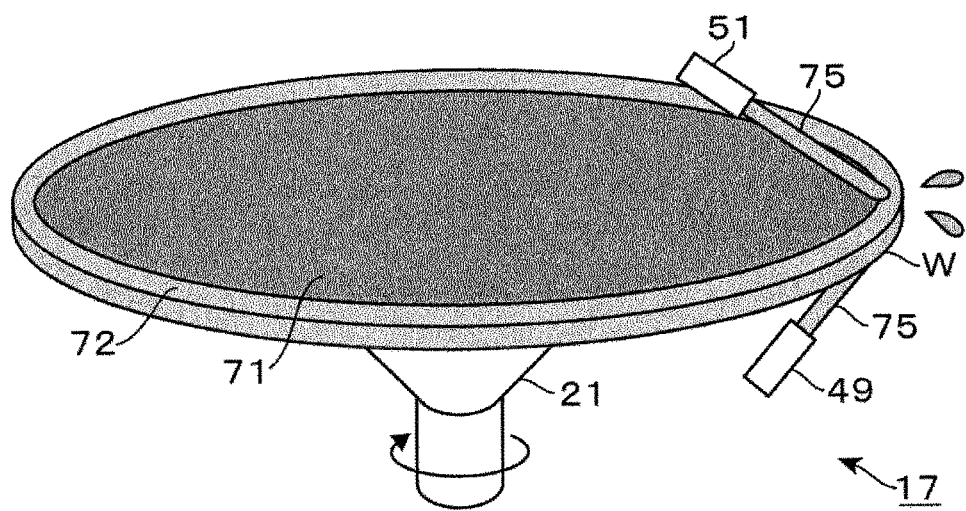
FIG. 11 is a perspective view showing a process step of removing unnecessary parts of the resist film.
Figure 20:
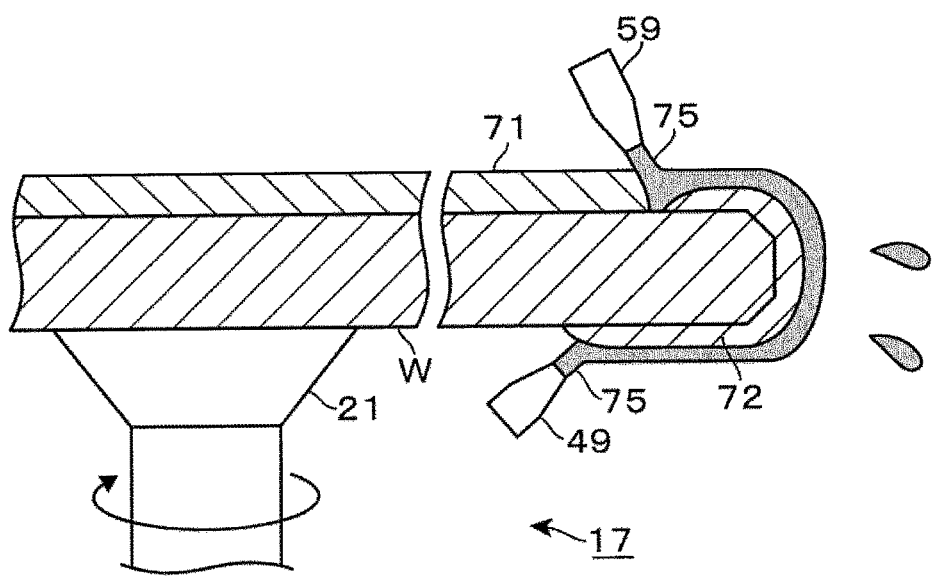
FIG. 20 is a perspective view showing the process step of removing the unnecessary parts of the resist film.

Thereafter, a solvent 75 is discharged from the upper solvent nozzle 59 for resist film removal to the peripheral part of the front surface of the wafer W, and a solvent 75 is discharged from the lower solvent nozzle 49 for resist film removal to the peripheral part of the rear surface of the wafer W. Due to the fact that the solvents are discharged from the nozzles 59 and 49 to the outside of the wafer W and the centrifugal force of the rotation of the wafer W, the solvents 75 respectively supplied to the front surface and the rear surface of the wafer W flow toward the circumferential side surface of the wafer W so as to be spun off from the circumferential side surface. Because of the solvent 75, a portion of the resist film 71, which is formed on the protective film 72, and a portion of the resist film 71, which extends on the front surface of the wafer W from the end of the protective film 72 slightly to the central part of the wafer W, as described in FIG. 6, are removed (FIGS. 11 and 20).

Figure 12:
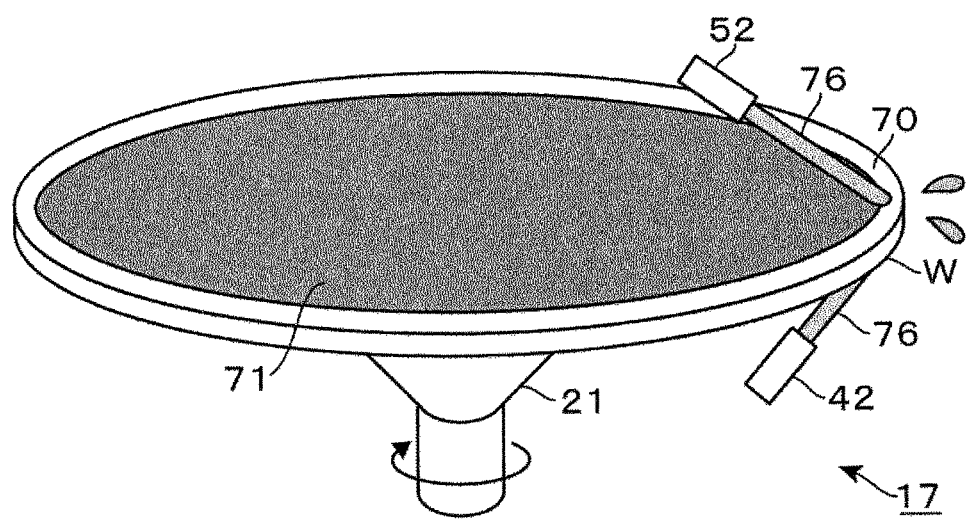
FIG. 12 is a perspective view showing a process step of removing the protective film.
Figure 21:
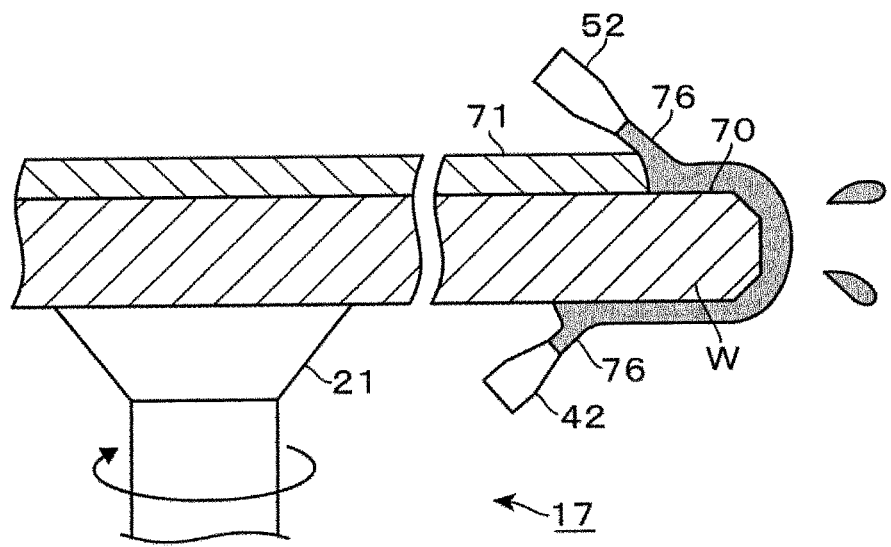
FIG. 21 is a perspective view showing the process step of removing the protective film.

Thereafter, the discharging of the solvent 75 from the upper solvent nozzle 59 for resist film removal and the lower solvent nozzle 49 for resist film removal is stopped. Then, a protective film removing solvent 76 is supplied to the peripheral part of the front surface of the wafer W from the upper solvent nozzle 52 for protective film removal, and a protective film removing solvent 76 is supplied to the peripheral part of the rear surface of the wafer W from the lower solvent nozzle 42 for protective film removal. Similar to the solvent 75, the solvents 76 flow on the front surface and the rear surface toward the circumferential side surface of the wafer W so as to be spun off from the circumferential side surface. On the front surface of the wafer W, the solvent 76 is supplied to the area which is described with reference to FIG. 6. The protective film 72 is dissolved by the solvent 76 so as to be removed (FIGS. 12 and 21).

After that, the discharging of solvent 76 from the upper solvent nozzle 52 for protective film removal and from the lower solvent nozzle 42 for protective film removal is stopped, and the rotation of the wafer W is stopped. The wafer W is transferred to the heating module 15 and heated, so that an organic medium contained in the resist film 71 evaporates. Following thereto, the wafer W is transferred to the exposure apparatus 12, and the resist film 71 is exposed along a predetermined pattern.

Figure 13:
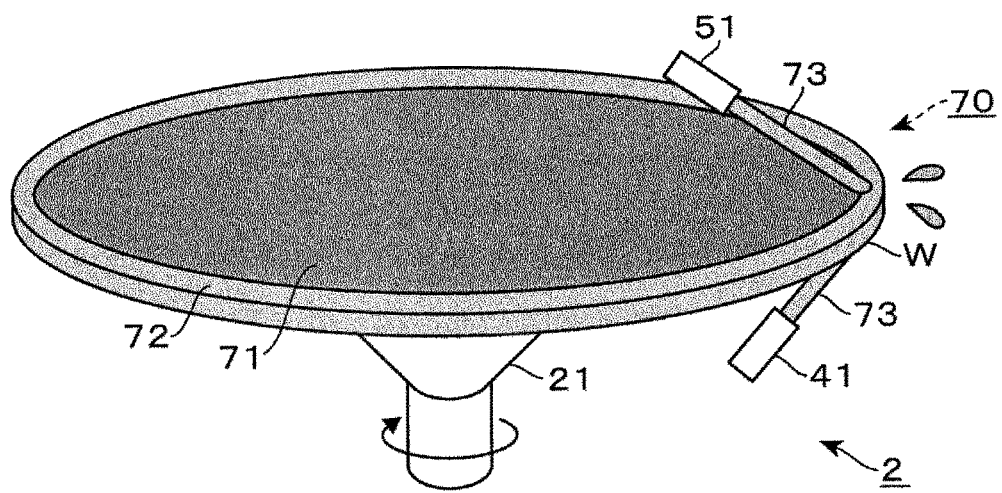
FIG. 13 is a perspective view showing a process step of forming a protective film.
Figure 22:
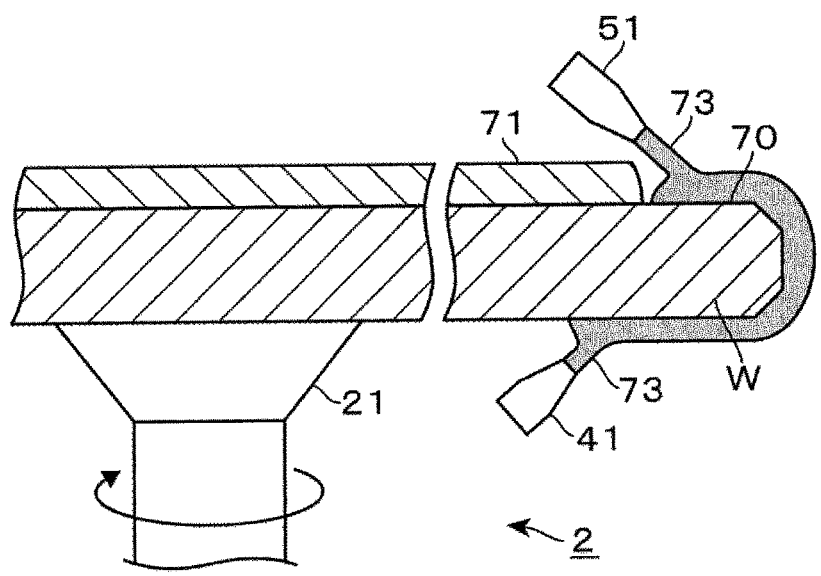
FIG. 22 is a perspective view showing the process step of forming the protective film.

The exposed wafer W is transferred to the heating module 16 and is subjected to the PEB. Then, the wafer W is transferred to the developing module 2, placed on the spin chuck 21 and rotated. Then, similar to the process in the protective film forming module 13, a chemical liquid 73 for protective film formation is discharged from the upper chemical nozzle 51 for protective film formation and a chemical liquid 73 for protective film formation is discharged from the lower chemical nozzle 41 for protective film formation (FIGS. 13 and 22). After the discharging of the chemical liquid 73 from the nozzles 51 and 41 has been stopped, the chemical liquid 73 supplied to the wafer W dries so that a protective film 72 that is a first protective film covering the metal adhesion prevention area 70 is formed. Namely, the protective film 72 is formed on the peripheral part of the wafer W where the resist film 71 is not formed.

Figure 14:
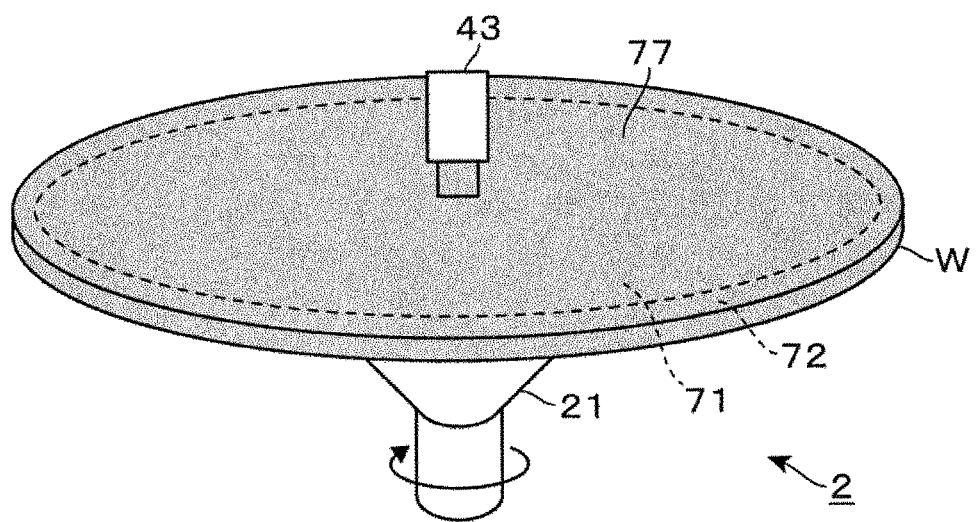
FIG. 14 is a perspective view showing a process step of development.
Figure 23:
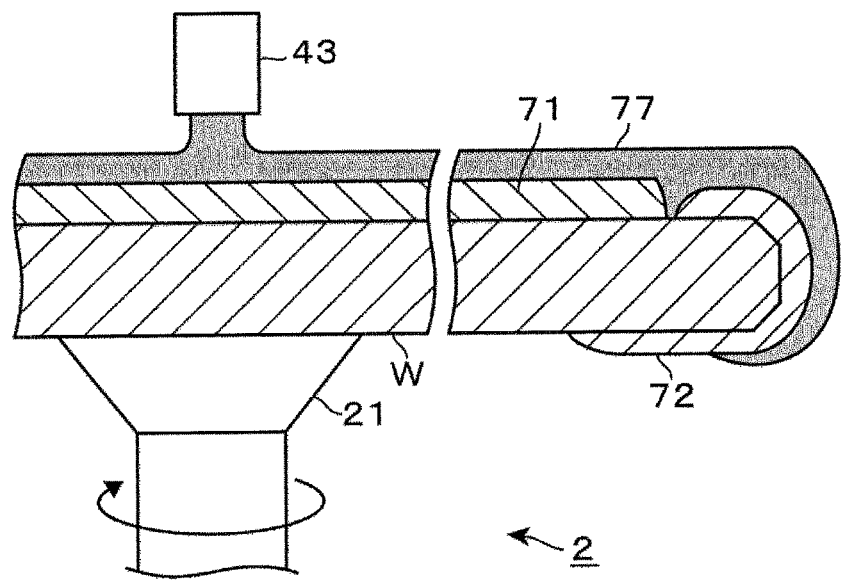
FIG. 23 is a perspective view showing the process step of development.

After the organic medium contained in the protective film 72 has been subjected to the air flow in the cup 24 so as to be sufficiently evaporated, a developer 77 is discharged to the peripheral part of the wafer W from the developer nozzle 43 located above the peripheral part of the wafer W. Then, the developer nozzle 43 is horizontally moved such that the discharging position of the developer 77 moves toward the central part of the developer nozzle 43, and is stopped above the central part of the wafer W. Thus, the front surface of the wafer W is covered with the developer as a whole. The developer develops the resist film 71, so that the exposed parts of the resist film 71 are dissolved, whereby a resist pattern is formed (FIGS. 14 and 23).

Figure 24:
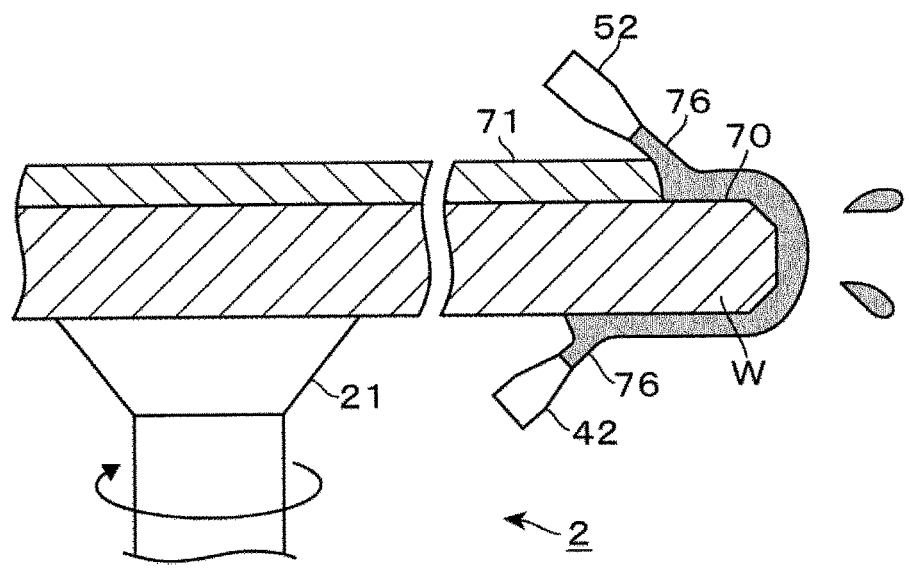
FIG. 24 is a perspective view showing the process step of removing the protective film.
Figure 25:
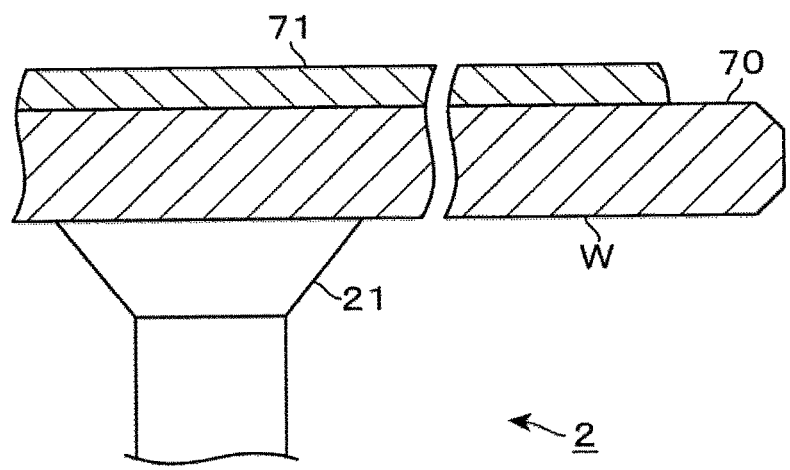
FIG. 25 is a perspective view showing the end of the process steps.

Thereafter, discharging of the developer 77 from the developer nozzle 43 is stopped, and the developer 77 is spun off and removed from the wafer W by the rotation of the wafer W. Then, similar to the process performed by the resist film forming module 17, the solvent 76 is supplied to the wafer W from the upper solvent nozzle 52 for protective film removal and from the lower solvent nozzle 42 for protective film removal, so that the protective film 72 is removed (FIGS. 15 and 24). After that, the supply of the solvent 76 from the upper solvent nozzle 52 for protective film removal and the lower solvent nozzle 42 for protective film removal is stopped, and the rotation of the wafer W is stopped (FIGS. 16 and 25). Then, the wafer W is returned to the carrier 18.

According to this coating and developing apparatus 1, the resist film 71 formed on the surface of the wafer W is developed by supplying thereto the developer 77, with the metal adhesion prevention area 70 including the peripheral end surface and the peripheral portion of the rear surface of the wafer W being covered with the protective film 72. Thus, adhesion of the metal, which is contained in the resist dissolved in the developer 77, to the metal adhesion prevention area 70 can be prevented. Further, the resist film 71 is formed by supplying the surface of the wafer W with the resist 74 containing the metal, with the metal adhesion prevention area 70 being covered with the protective film 72. Thus, the adhesion of the metal to the metal adhesion prevention area 70 can be more reliably prevented.

In addition, in this coating and developing apparatus 1, the formation of the protective film 72, the developing process and the removal of the protective film 72 are performed, while the wafer W is being placed on the spin chuck 21 in the developing module 2. Namely, since the spin chuck 21 is a stage unit that is commonly used in these processes, it is not necessary to transfer the wafer W in order to perform these processes. Thus, a throughput can be improved. Since the developing module 2 also serves as the protective-film forming module, the installation number of protective-film forming modules in the coating and developing apparatus 1 can be decreased, and the installation number of the developing modules 2 can be increased. Due to the increased installation number of the developing modules 2, a throughput can be improved.

In the developing module 2, for example, a heating unit such as a light-emitting diode may be provided in the cup 24. In this case, the heating unit heats the protective film 72 so as to promptly remove the organic medium in the protective film 72. Alternatively, since it is sufficient that the protective film 72 formed in the protective-film forming module 13 is removed before the wafer W is loaded into the exposure apparatus 12, the protective film 72 may be removed after the heating process performed by the heating module 15.

For the sake of convenience, FIG. 1 shows the schematic view of the coating and developing apparatus 1. Herebelow, a more detailed structural example of the coating and developing apparatus 1 is described with reference to FIGS. 26, 27 and 28 that are a plan view, a perspective view and a vertical sectional view, respectively. The coating and developing apparatus 1 is formed by linearly connecting a carrier block D1, a processing block D2 and an interface block D3 in the lateral direction. The interface block D3 is connected to the exposure apparatus 12. In the description below, the arrangement direction of the blocks D1 to D3 is assumed as a back and forth direction. The carrier block D1 includes a stage 81 of the carrier 18, an opening and closing unit 82, and a transfer arm 83 that transfers a wafer W from the carrier 18 through the opening and closing unit 82.

The processing block D2 is formed by stacking first to sixth unit blocks E1 to E6 in this order from below, which perform a liquid process and a heating process to a wafer W. Transfer and processing of wafers W are simultaneously performed in the respective unit blocks. The unit blocks E1 and E2 are the same, the unit blocks E3 and E4 are the same, and the unit blocks E5 and E6 are the same. A wafer W is selected by one of the same blocks and is transferred thereto.

Figure 26:
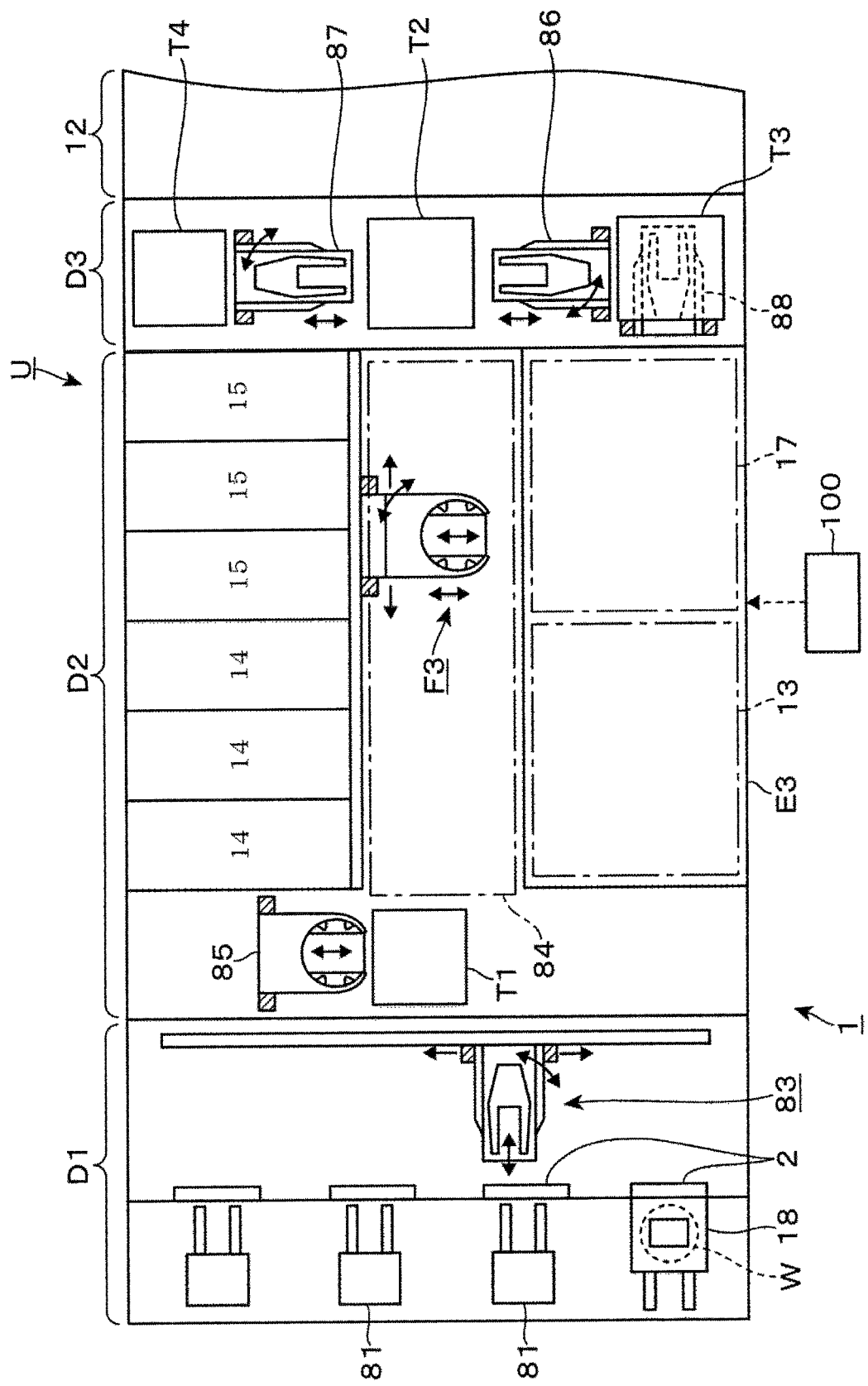
FIG. 26 is a horizontally-sectioned top plan view showing a specific example of the coating and developing apparatus.

The unit block E3 is described as a representative of the unit blocks, with reference to FIG. 26. A shelf unit U is disposed on one of the right and left sides of a transfer area 84 which extends from the carrier block D1 toward the interface block D3. The protective film forming module 13 and the resist film forming module 17 are arranged on the other side in the back and forth direction. The shelf unit U includes the heating modules 14 and 15. The transfer area 84 is provided with a transfer arm F3 that accesses the respective modules in the unit block E3 and respective modules of towers T1 and T2 described later, which are disposed on the same height of the unit block E3, so as to transfer a wafer W thereto.

Figure 27:
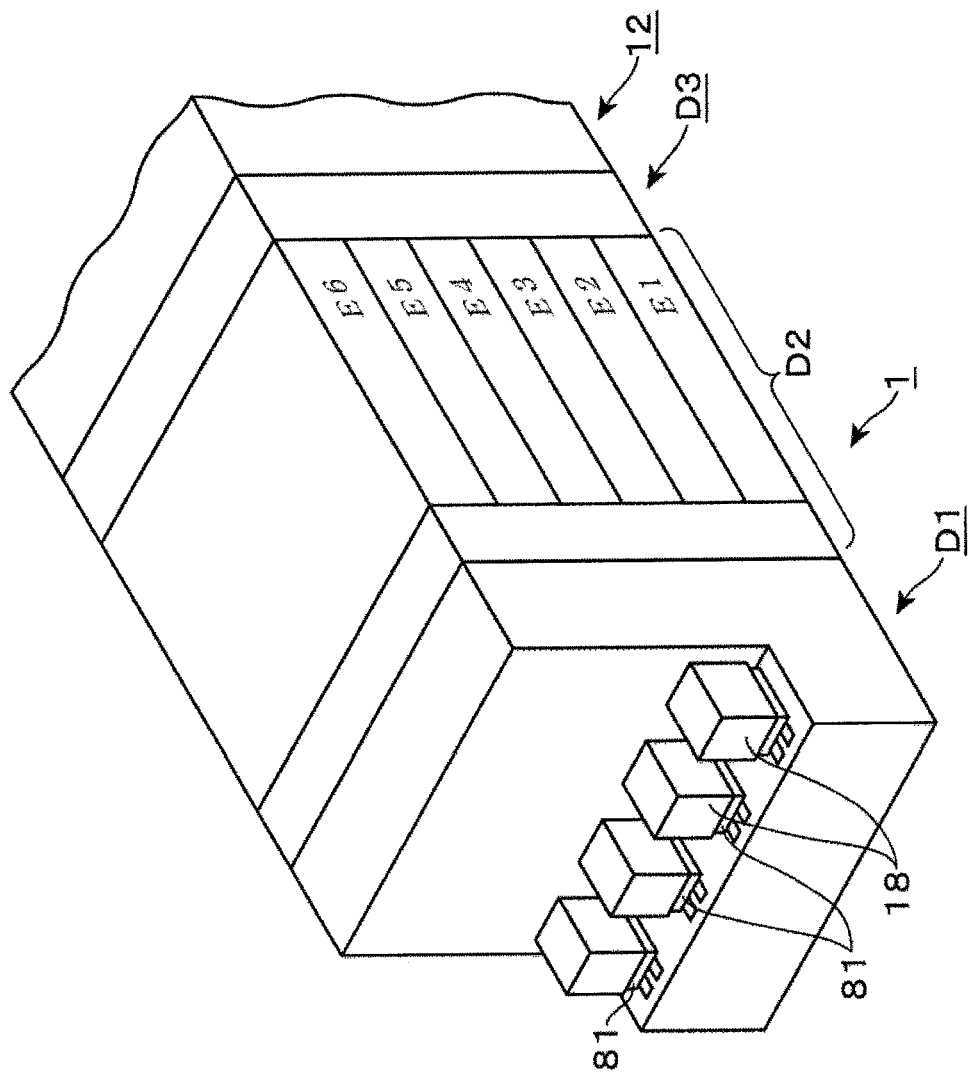
FIG. 27 is a perspective view showing the specific example of the coating and developing apparatus.

The unit blocks E1 and E2 have a similar structure to that of the unit block E3, excluding that the unit blocks E1 and E2 have an antireflection-film forming modules for applying a chemical liquid for forming an antireflection film to a wafer W, in place of the resist film forming module 17 and the protective film forming module 13, and that the shelf unit U has a heating module for heating a wafer W on which an antireflection film has been formed. The unit blocks E5 and E6 have a similar structure to that of the unit block E3, excluding that the unit blocks E5 and E6 have two developing modules 2 in place of the resist film forming module 17 and the protective film forming module 13, and that the unit shelf U has the heating module 16. In FIG. 27, transfer arms of the unit blocks E1 to E6 are indicated by the reference numerals F1 to F6.

On the side of the carrier block D1 in the processing block D2, there are the tower T1 vertically extending along the respective unit blocks E1 to E6, and a vertically movable transfer arm 85 for transferring a wafer W to and from the tower T1. The tower T1 has a plurality of transfer modules TRS stacked one on another. In the transfer modules TRS, a wafer W is temporarily placed for the purpose that the wafer W is transferred to the respective blocks.

The interface block D3 includes towers T2, T3 and T4 vertically extending along the respective unit blocks E1 to E6, and has a vertically movable interface arm 86 for transferring a wafer W to and from the towers T2 and T3, an interface arm 87 that is a vertically-movable transfer mechanism for transferring a wafer W to and from the towers T2 and T4, and an interface arm 88 for transferring a wafer W between the tower T2 and the exposure apparatus 12. The aforementioned transfer mechanism 11 is composed of the interface arms 86 to 88, the transfer arms F1 to F6 and the transfer arms 83 and 85.

Although the tower T2 is formed by stacking one on another the transfer modules TRS, a buffer module in which a plurality of wafers W before being exposed are stored and stocked, a temperature adjusting module for adjusting a temperature of a wafer W and so on, illustration of these modules other than the transfer modules TRS is omitted. Although the respective towers T3 and T4 are also equipped with modules, an explanation of which is omitted.

A transfer route of a wafer W in this coating and developing apparatus 1 is described. A wafer W is transferred by the transfer arm 83 from the carrier 18 to the transfer module TRS0 of the tower T1, and is then transferred from the TRS0 to one of the unit blocks E1 and E2. When the wafer W is transferred to the unit block E1, the wafer W is transferred from the TRS0 to the transfer module TRS1 (transfer module capable of transferring the wafer W by the transfer arm F1) out of the transfer modules TRS of the tower T1, which corresponds to the unit block E1. On the other hand, when the wafer W is transferred to the unit block E2, the wafer W is transferred from the TRS0 to the transfer module TRS2 out of the transfer modules TRS of the tower T1, which corresponds to unit block E2. The transferring of the wafer W is performed by the transfer arm 85.

In this manner, the wafer W is transferred to the TRS1 (TRS2), the antireflection-film forming module, the heating module, and the TRS1 (TRS2) in this order. Then, the wafer W is transferred by the transfer arm 85 to one of the transfer module TRS3 corresponding to the unit block E3, and the transfer module TRS4 corresponding to the unit block E4. As described with reference to FIG. 1, the wafer W transferred to one of the TRS3 and the TRS4 is transferred to the protective film forming module 13, the heating module 14, the resist film forming module 17, and the heating module 15 in this order, and is transferred to the transfer module TRS31 (TRS41) of the tower T2.

Thereafter, the wafer W is transferred to the exposure apparatus 12 by the interface arms 86 and 88. The exposed wafer W is transferred by the interface arms 87 and 88 to the transfer module TRS51 or TRS61 corresponding to the unit block E5 or E6. After that, as described with reference to FIG. 1, the wafer W is transferred to the heating module 16 and the developing module 2 in this order. After a resist pattern has been formed, the wafer W is transferred to the transfer module TRS5 (TRS6) of the tower T1, and is returned to the carrier 18 through the transfer arm 83.

Second Embodiment

Figure 29:
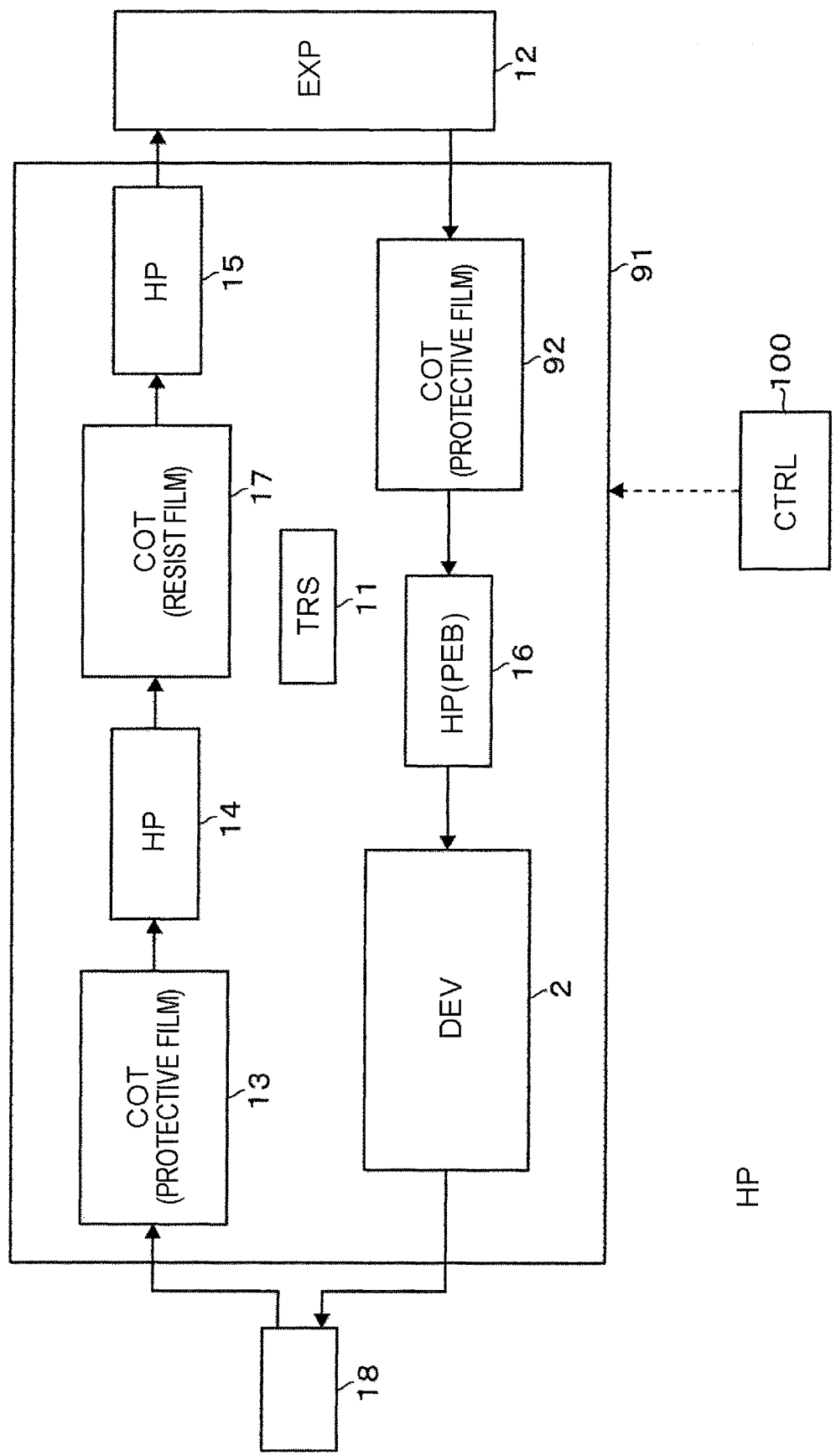
FIG. 29 is a schematic structural diagram of a coating and developing apparatus in a second embodiment of the present invention.

Herebelow, other embodiments are described, mainly giving attention to their differences from the first embodiment. FIG. 29 shows a schematic structure of a coating and developing apparatus 91 according to a second embodiment. Similarly to FIG. 1, solid arrows in FIG. 29 show a transfer route of a wafer W. The coating and developing apparatus 91 is provided with a protective film forming module (COT (Protective Film)) 92 that forms the protective film 72 after the exposure by the exposure apparatus 12 and before the PEB by the heating module 16. The protective film forming module 92 has the similar structure to that of the aforementioned protective film forming module 13. The protective film 72 is formed by the protective film forming module 92. Thus, in the developing module 2, the protective film 72 is not formed, but only the development and removal of the protective film 72 are performed, as described with reference to FIGS. 14 and 15.

Figure 28:
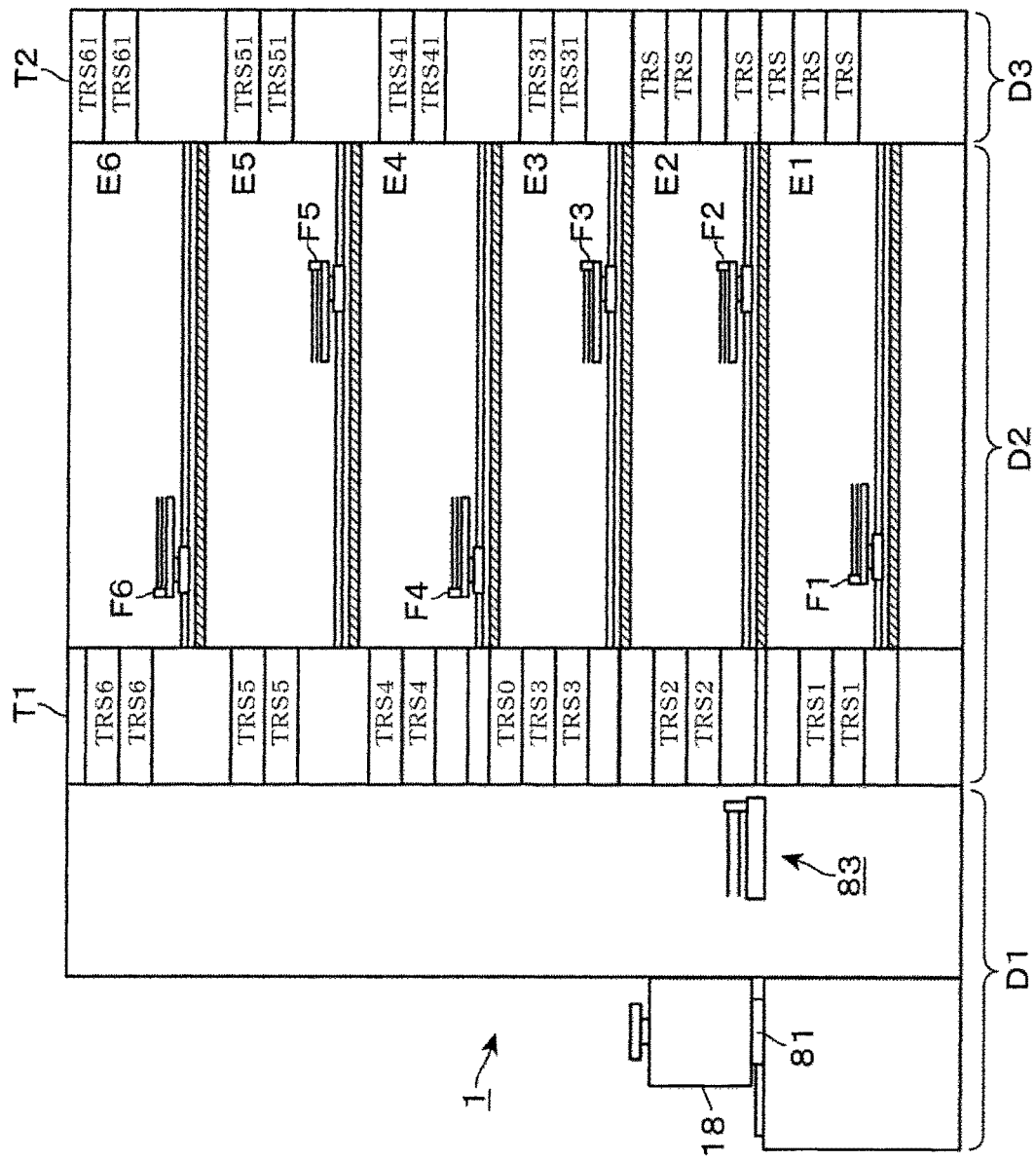
FIG. 28 is a vertical sectional view showing the specific example of the coating and developing apparatus.

The protective film forming module 92 is provided, in place of one of the two developing modules 2 that are arranged in the back and forth direction, for example, in the unit blocks E5 and E6 of the coating and developing apparatus 1, as described with reference to FIGS. 26 to 28. Namely, in each unit block E5, E6 of the coating and developing apparatus 91, the developing module 2 and the protective film forming module 92 are arranged in the back and forth direction. In the unit block E5, E6, a wafer W is transferred to the protective film forming module 92, the heating module 16 and the developing module 2, in this order.

In the coating and developing apparatus 91 in the second embodiment, since the PEB is performed by the heating module 16 after the protective film 72 has been formed by the protective film forming module 92, the organic medium contained in the protective film 72 can be evaporated during the PEB. Thus, after the protective film 72 has been formed by the protective film forming module 92, it can be prevented that the wafer W is kept in the cup 24 of the protective film forming module 92 for a long period of time, in order to evaporate the organic medium contained in the protective film 72. As a result, a throughput can be improved.

Third Embodiment

Figure 6:
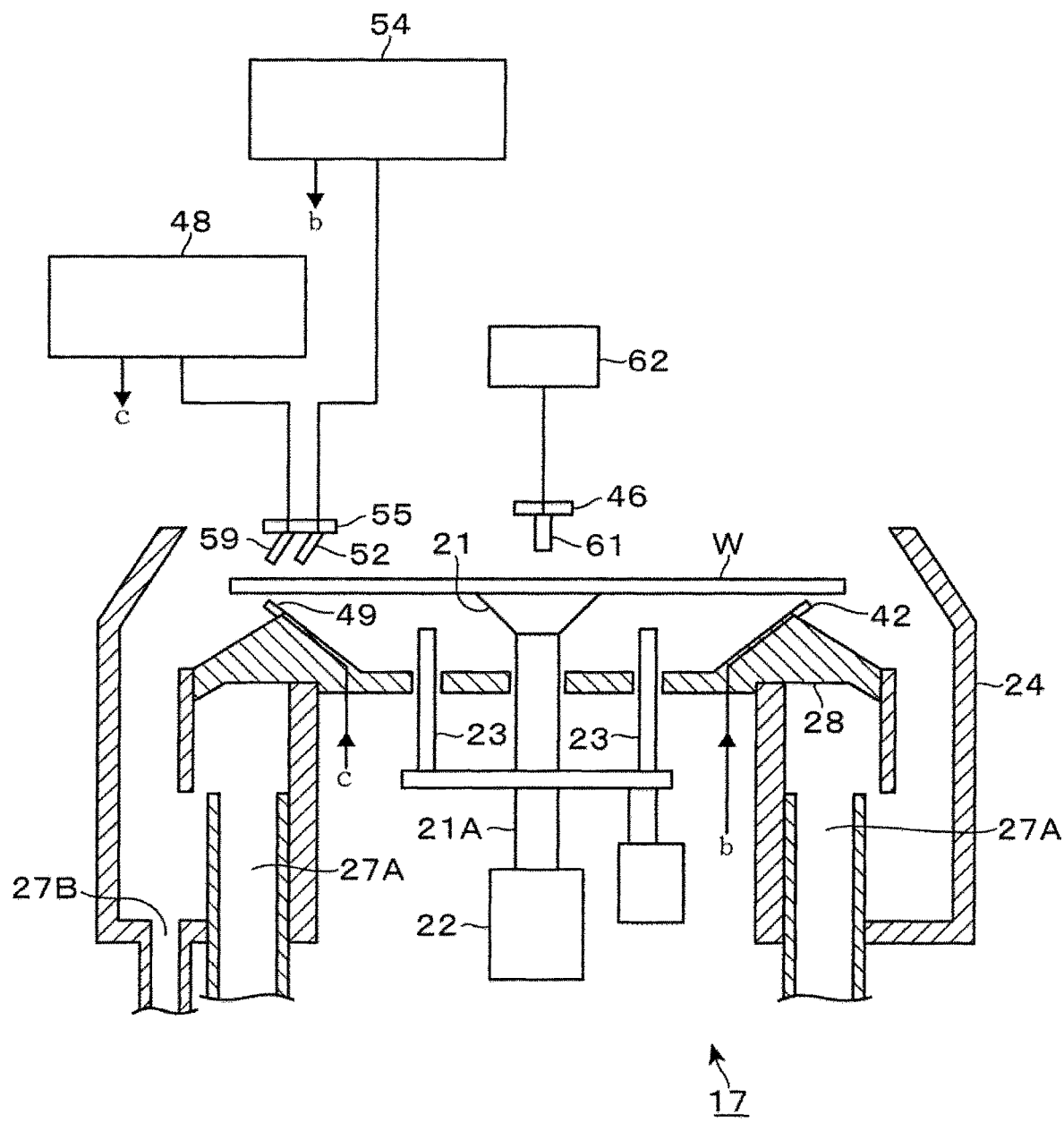
FIG. 6 is a vertical sectional view of a resist film forming module provided in the coating and developing apparatus.
Figure 30:
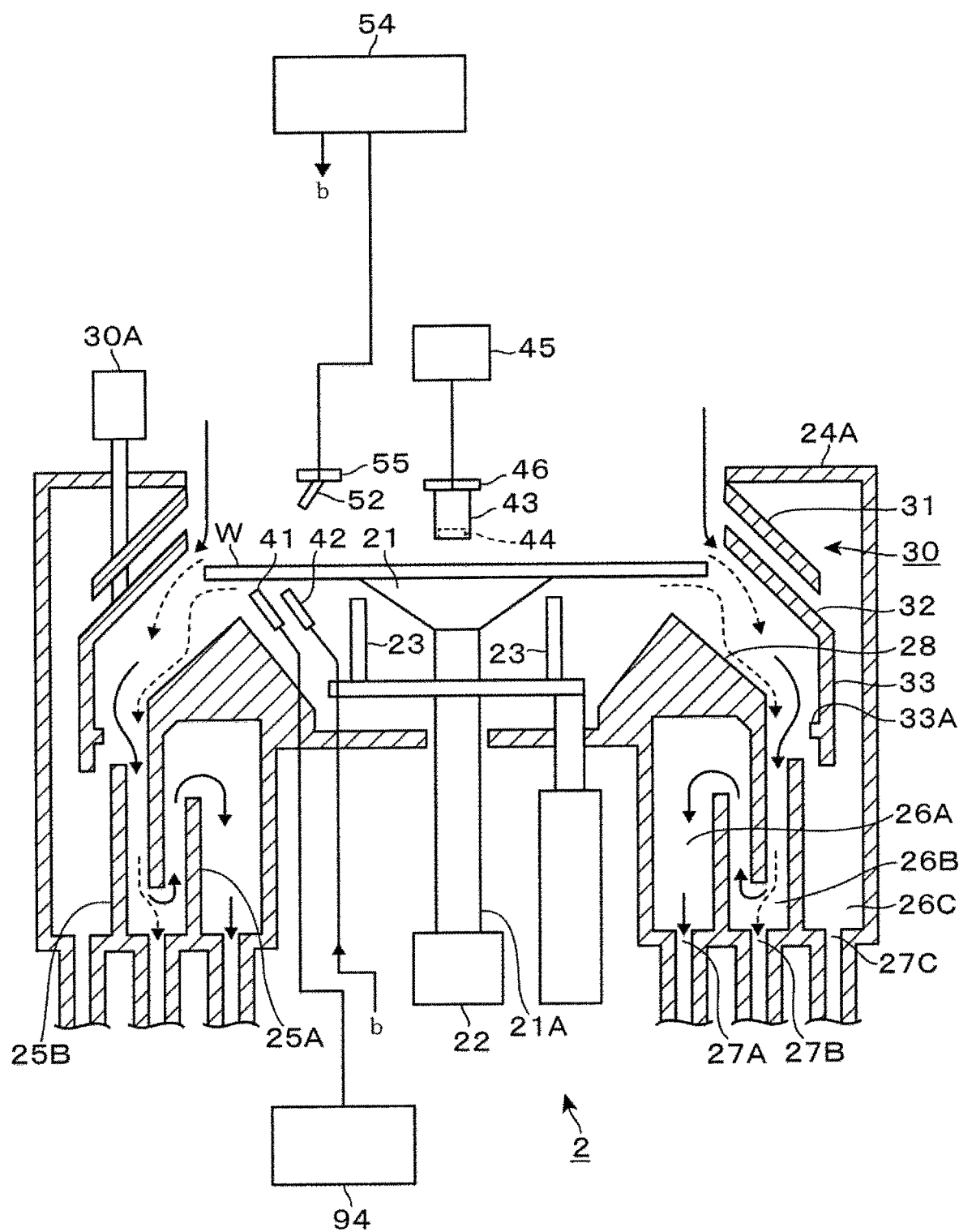
FIG. 30 is a vertical sectional view of a developing module used in a third embodiment of the present invention.

A resist film forming module 17 in a coating and developing apparatus in a third embodiment is not equipped with the upper solvent nozzle 52 for protective film removal shown in FIG. 6. Thus, only a portion of the protective film 72, which is formed on the rear surface of the wafer W, is removed by a solvent discharged from the lower solvent nozzle 42 for protective film removal. Since the protective film 72 is not formed by the developing module 2, the upper chemical nozzle 51 for protective film formation and the lower chemical nozzle 41 for protective film formation are not provided, as shown in FIG. 30. Instead, similar to the lower chemical nozzle 41 for protective film formation, there is provided a process liquid nozzle 93 for liquid film formation that discharges a chemical liquid diagonally upward from the inside to the outside of the wafer W. The reference numeral 94 depicts a chemical liquid supply source that stores the process liquid and supplies the process liquid to the process liquid nozzle 93 for liquid film formation.

Figure 31:
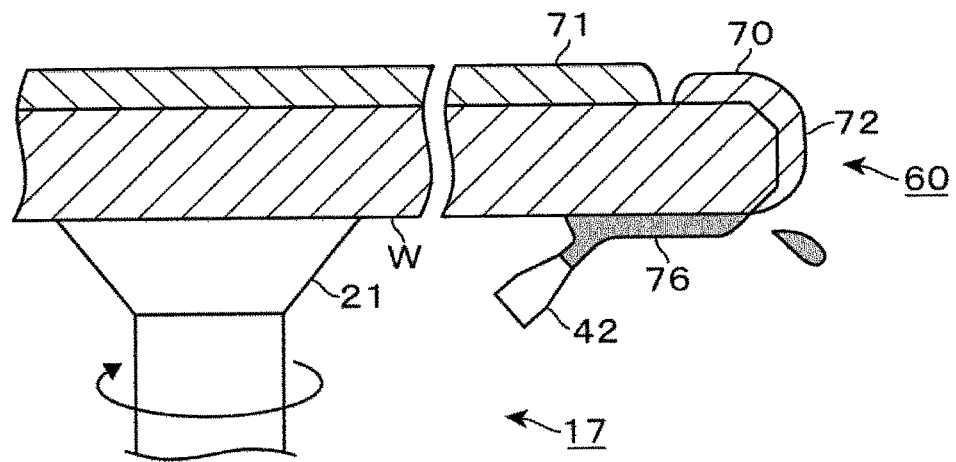
FIG. 31 is a vertical sectional view of a process step of a wafer in the third embodiment.

Herebelow, a process performed by the coating and developing apparatus in the third embodiment is described. As described above, the protective film 72 is formed by the protective film forming module 13. Then, the resist film 71 is formed and an unnecessary part of the resist film 71 on the peripheral part is removed by the resist film forming module 17. After that, the solvent 76 is discharged from the lower solvent nozzle 42 for protective film removal onto the rear surface of the rotating wafer W. The rotation speed of the wafer W is controlled such that the the solvent 76 does not flow onto the bevel on the rear side and the circumferential side surface of the wafer W. When protective film 72 on the rear surface of the wafer W is removed so that the rear surface becomes flat (FIG. 31), the discharging of the solvent 76 and the rotation of the wafer W are stopped. As described above, since the flowing of the solvent 76 onto the bevel on the rear side and the circumferential side surface of the wafer W is prevented, the protective film 72 remains on the front surface of the wafer W, the bevel on the front side, the circumferential side surface and the bevel on the rear side.

Figure 32:
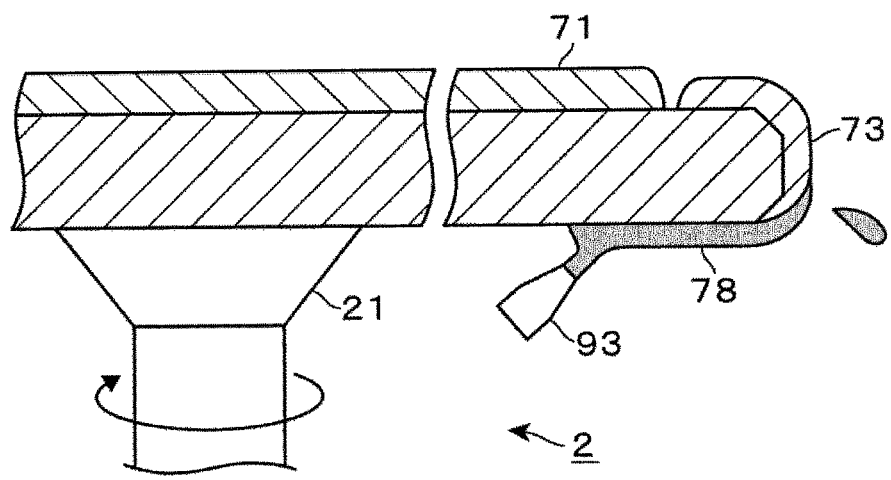
FIG. 32 is a vertical sectional view showing a process step of the wafer.

After being exposed by the exposure apparatus 12 and subjected to the PEB in this order, the wafer W is transferred to the spin chuck 21 of the developing module 2 and is rotated. A process liquid 78 is discharged onto the rear surface of the wafer W from the process liquid nozzle 93 for liquid film formation. The discharged process liquid 78 flows on the rear surface of the wafer W toward the circumferential edge thereof so as to be spun off from the wafer W. Since the wafer W is rotated, a liquid film formed of the process liquid 78 is formed on the overall circumference of the rear surface of the wafer W. Thus, the metal adhesion prevention area 70 is covered with the liquid film of the process liquid 78 and the protective film 72 (FIG. 32).

Figure 33:
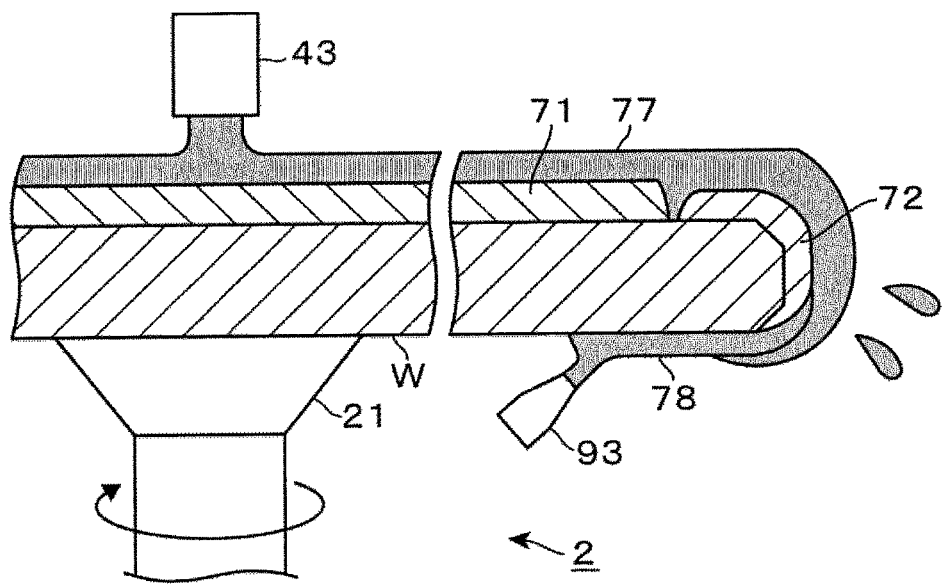
FIG. 33 is a vertical sectional view showing a process step of the wafer in the third embodiment.
Figure 34:
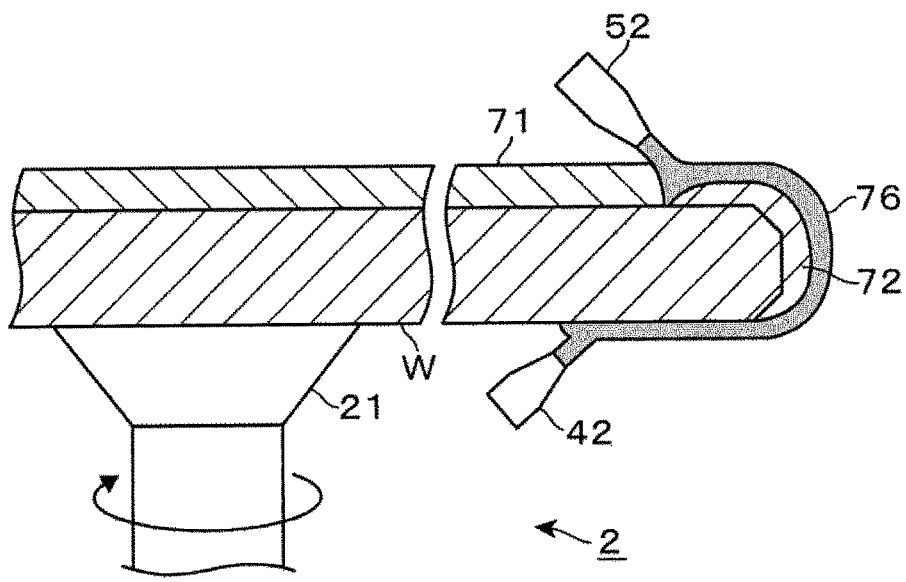
FIG. 34 is a vertical sectional view showing a process step of the wafer in the third embodiment.

Following thereto, the developer 77 is supplied from the developer nozzle 43 to the wafer W (FIG. 33). Due to the process liquid 78 and the protective film 72, the development proceeds while the contact of the developer 77 to the metal adhesion prevention area 70 is prevented. When the supply of the developer 77 from the developer nozzle 43 is stopped and the developer 77 is spun off from the wafer W, the discharging of the process liquid 78 from the process liquid nozzle 93 for liquid film formation is stopped so that the formation of the liquid film is stopped. Thereafter, the solvent 76 is discharged from the upper solvent nozzle 52 for protective film removal and the lower solvent nozzle 42 for protective film removal, so that the protective film 72 is removed (FIG. 34).

In the coating and developing apparatus in the third embodiment, before transferring of the wafer W to the exposure apparatus 12, a part of the protective film 72 on the rear surface of the wafer W is exclusively removed. Thus, when the wafer W is placed on the stage of the exposure apparatus 12, it can be prevented that the height of the wafer W is displaced from the correct height due to the presence of the protective film 72. Thus, it can be prevented that a position of the wafer W to be exposed is displaced from the correct position. In addition, in this coating and developing apparatus, since the protective film 72 is formed only once, a poor throughput caused by the formation of the protective film 72 can be prevented in the coating and developing apparatus. Any liquid can be used as the process liquid 78, as long as the liquid does not dissolve the process liquid 78. For example, an organic medium may be used.

Fourth Embodiment

A coating and developing apparatus in a fourth embodiment is described. In the fourth embodiment, similarly to the third embodiment, before a wafer W is loaded into the exposure apparatus 12, the protective film on the rear side of the wafer W is exclusively removed. In order to achieve the exclusive removal of the protective film more reliably, an upper protective film (on the front side) and a lower protective film (on the rear side), which cover the metal adhesion prevention area 70, are made of materials different from each other. When the lower protective film is removed, a solvent capable of selectively removing the lower protective film is supplied to the wafer W. In order that the protective films are made of different materials, the upper chemical nozzle 51 for protective film formation and the lower chemical nozzle 41 for protective film formation in the protective film forming module 13, which are described with reference to FIG. 5, are connected to chemical liquid supply sources in which chemical liquids of components different from each other are stored.

Figure 35:
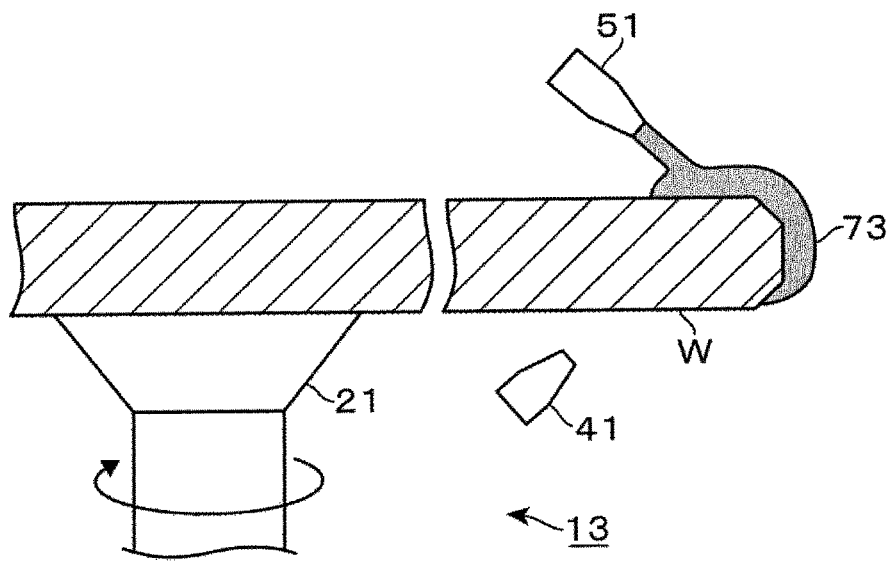
FIG. 35 is a vertical sectional view showing a process step of a wafer in a fourth embodiment of the present invention.
Figure 36:
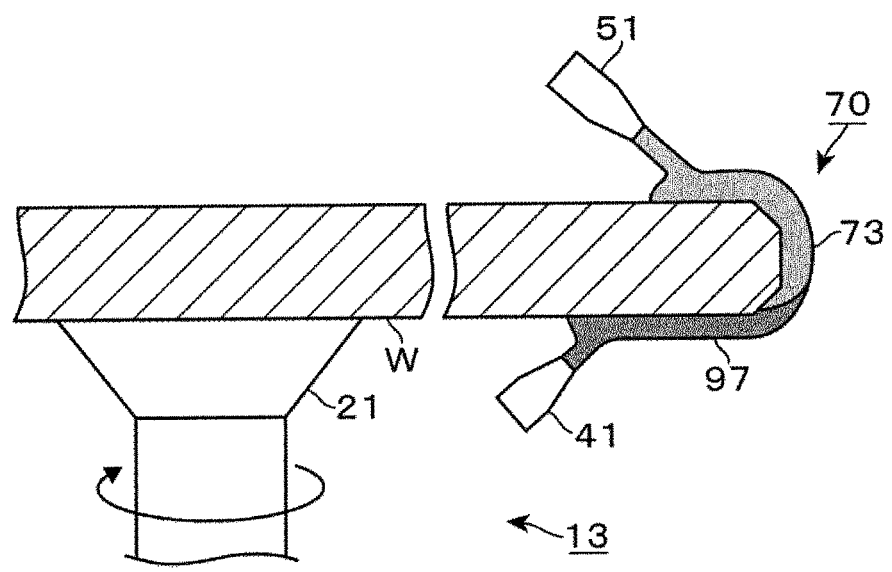
FIG. 36 is a vertical sectional view of a process step of the wafer in the fourth embodiment.

The process of the coating and developing apparatus in the fourth embodiment is described. At first, in the protective film forming module 13, the chemical liquid 73 is discharged from the upper chemical nozzle 51 for protective film formation onto the peripheral part of the front surface of the rotating wafer W to reach the bevel on the rear side of the wafer W (FIG. 35). Thereafter, a chemical liquid 97, which is different from the chemical liquid 73 in component, is discharged from the lower chemical nozzle 41 for protective film formation onto the peripheral part of the rear surface of the wafer W to approach the bevel on the rear side of the wafer W (FIG. 36). The discharging of the chemical liquid 73 and the chemical liquid 97 from the upper chemical nozzle 51 for protective film formation and the lower chemical nozzle 41 for protective film formation is stopped, and a protective film covering the metal adhesion prevention area 70 is formed. The protective films formed of the chemical liquids 73 and 97 are referred to as "upper protective film 98" and "lower protective film 99", respectively.

Figure 37:
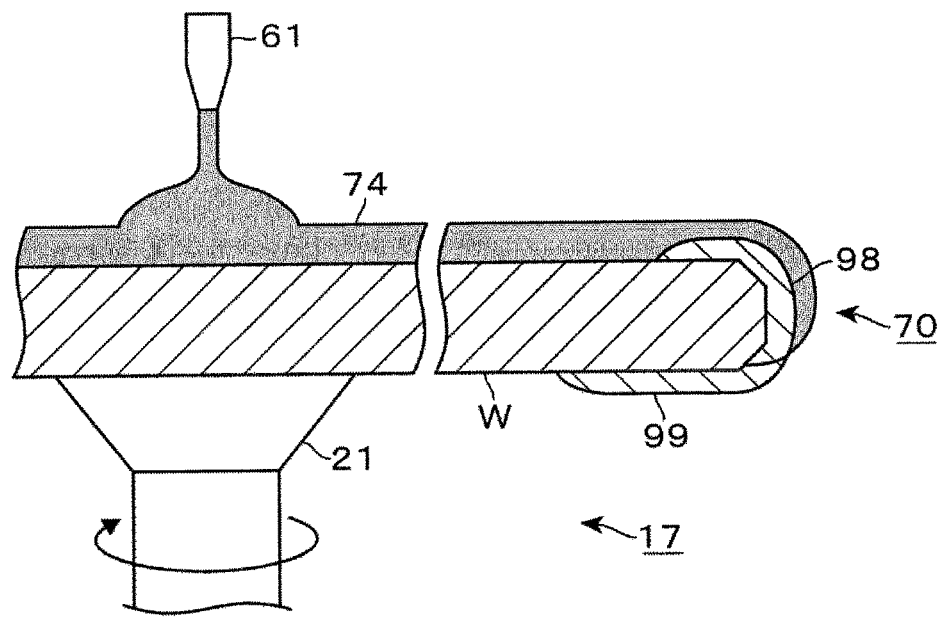
FIG. 37 is a vertical sectional view showing a process step of the wafer.
Figure 38:
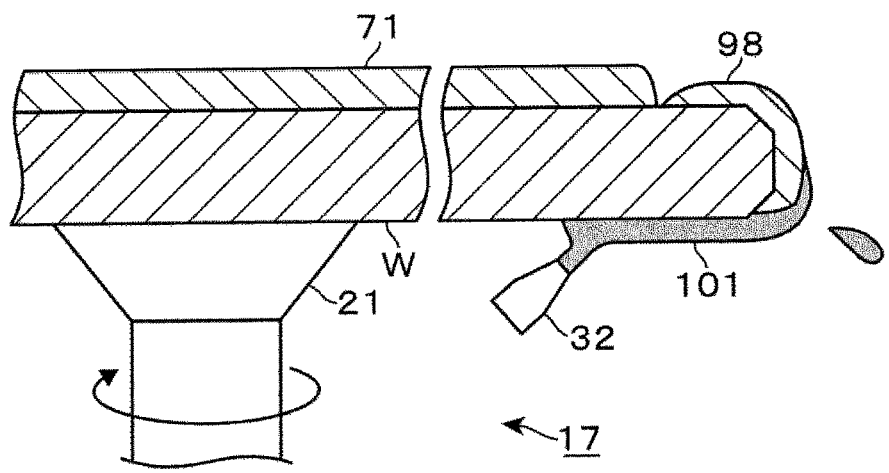
FIG. 38 is a vertical sectional view showing a process step of the wafer.

After the formation of the upper protective film 98 and the lower protective film 99, the wafer W is heated by the heating module 14 so that organic media remaining in the upper protective film 98 and the lower protective film 99 are removed. Thereafter, the wafer W is transferred to the resist film forming module 17. As described above, the wafer W is rotated, and the resist 74 is discharged from the resist nozzle 61 (FIG. 37), so that the resist film 71 is formed. After an unnecessary portion of the resist film 71 has been removed by supplying thereto a solvent, a solvent 101 for the lower protective film 99 is discharged from the lower solvent nozzle 42 for protective film removal (FIG. 38). A solvent capable of selectively dissolving the lower protective film 99 out of the upper protective film 98 and the lower protective film 99 is used as the solvent 101.

Figure 39:
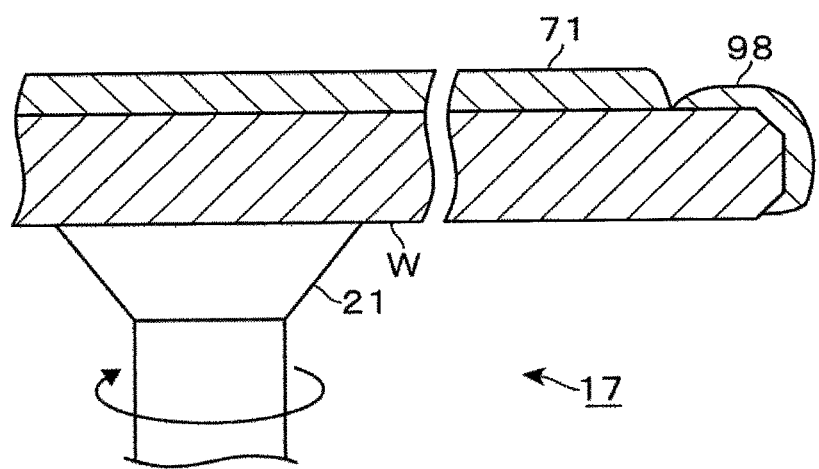
FIG. 39 is a vertical sectional view showing a process step of the wafer.

After the lower protective film 99 has been removed by the solvent 101, the discharging of the solvent 101 has been stopped (FIG. 39). After that, a process is performed similarly to the third embodiment. Thus, during the developing process, a liquid film by means of the process liquid 78 is formed on the rear surface of the wafer W from which the lower protective film 99 has been removed. Also in the fourth embodiment, the similar effect to that of the third embodiment can be obtained. The chemical liquid 97 forming the lower protective film 99 is formed of a negative-type resist or a positive-type resist, and the solvent 101 for the lower protective film 99 is a resist thinner.

Fifth Embodiment

Figure 40:
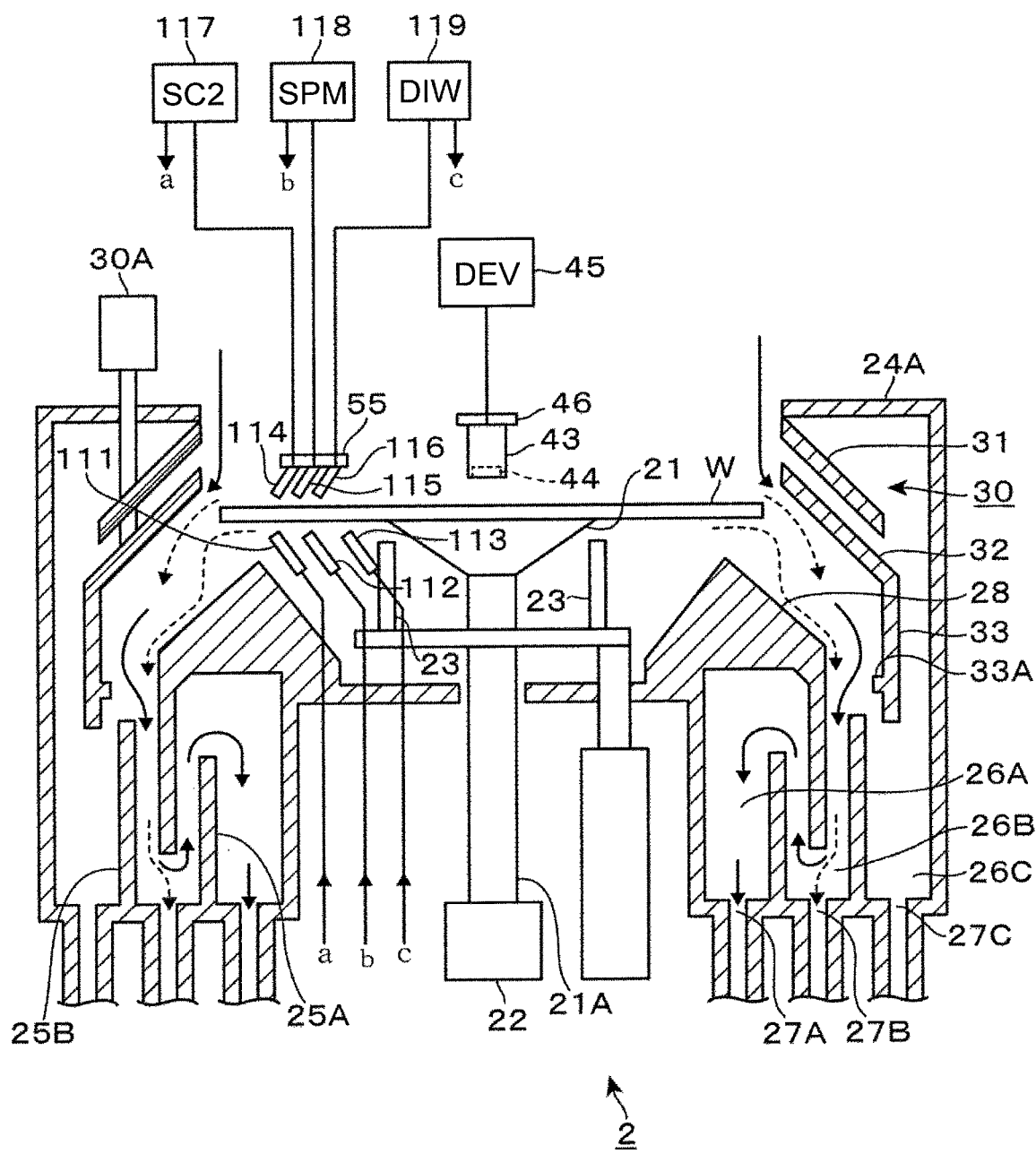
FIG. 40 is a vertical sectional view of a developing module used in a fifth embodiment of the present invention.

In a fifth embodiment, in a developing module 2 shown in FIG. 40, the developing process is performed without the metal adhesion prevention area 70 being covered with a protective film, and after the developing process, the metal adhesion prevention area 70 is supplied with SC2, SPM and deionized water in this order as cleaning liquids, for example, so that the metal adhesion prevention area 70 is cleaned. SC2 and SPM are metal removal liquids for removing the metal adhered to the wafer W. Deionized water is used for removing the SC2 and the SPM from the wafer W. The developing module 2 used in the fifth embodiment is equipped, below the wafer W, with a lower SC2 nozzle 111, a lower SPM nozzle 112 and a lower deionized water nozzle 113, in place of the chemical nozzle 41 for protective film formation and the upper lower solvent nozzle 42 for protective film removal. Similarly to the nozzles 41 and 42, the respective nozzles 111 to 113 can discharge liquids onto the peripheral portion of the rear surface of the wafer W outward from inside.

In addition, the arm 55 is equipped with an upper SC2 nozzle 114, an upper SPM nozzle 115 and an upper deionized water nozzle 116, in place of the upper chemical nozzle 51 for protective film formation and the upper solvent nozzle 52 for protective film removal. Similarly to the nozzles 51 and 52, the respective nozzles 114 to 116 can discharge liquids onto the peripheral part of the front surface of the wafer W outward from inside. The reference numeral 117 depicts an SPM supply source that supplies SPM stored therein to the nozzles 111 and 114. The reference numeral 118 depicts an SC2 supply source that supplies SC2 stored therein to the nozzles 112 and 115. The reference numeral 119 depicts a deionized-water supply source that supplies deionized water stored therein to the nozzles 113 and 116.

Figure 41:
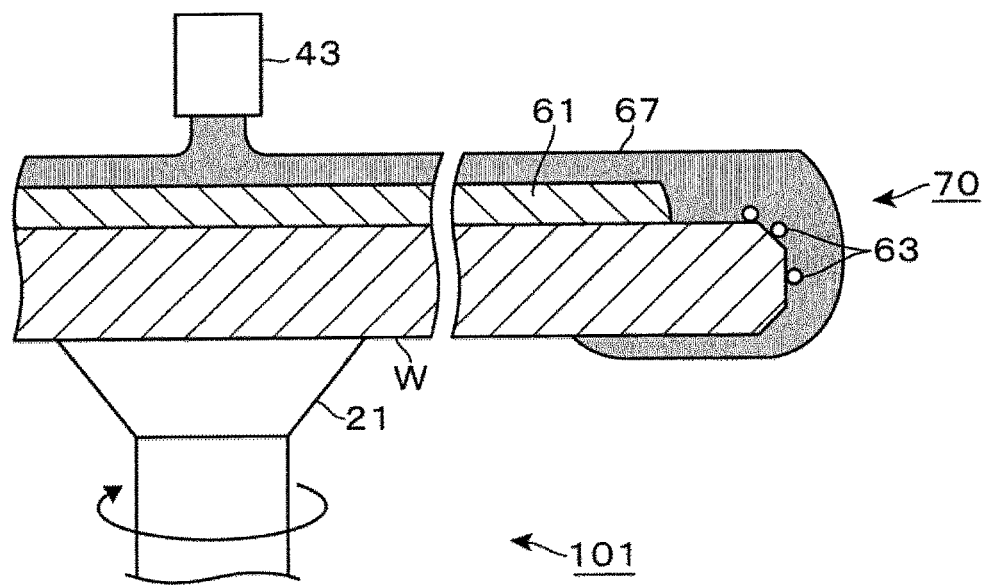
FIG. 41 is a vertical sectional view showing a process step of a wafer in the fifth embodiment.

A process of the developing module 2 in the fifth embodiment is described. At first, the developer 77 is supplied to the wafer W, and the developing process is performed (FIG. 41). As described above, the developing process is performed, with the metal adhesion prevention area 70 being exposed. After the supply of the developer 77 has been stopped and the developer 77 has been spun off by the rotation of the wafer W, SC2 is discharged onto the rear surface and the front surface of the rotating wafer W from the lower SC2 nozzle 111 and the upper SC2 nozzle 114. The SC2 discharged onto the rear surface of the wafer W and the SC2 discharged onto the front surface of the wafer W flow toward the circumferential edge of the wafer W to merge on the circumferential side surface. Then, the SC2 is spun off from the circumferential side surface.

Figure 42:
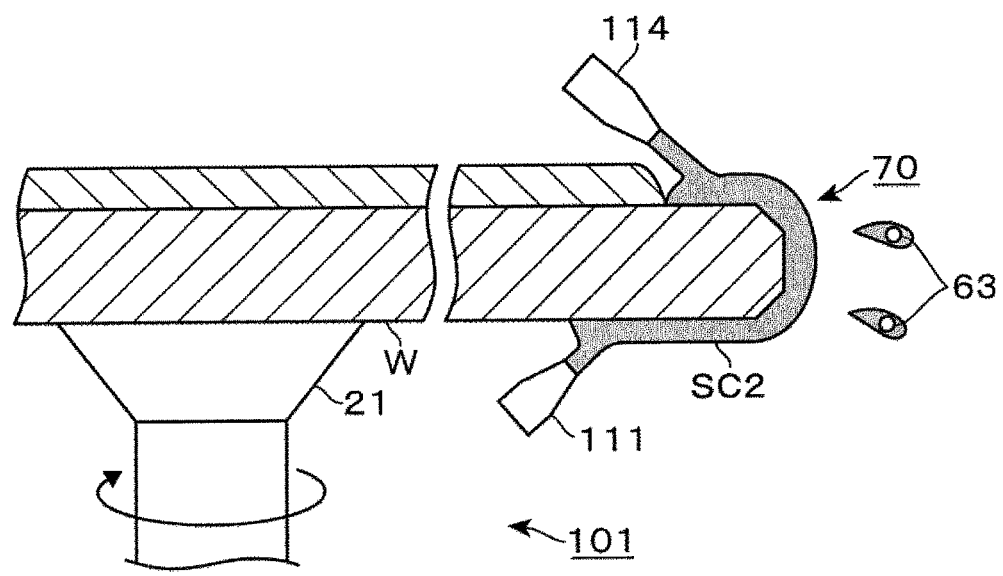
FIG. 42 is a vertical sectional view showing a process step of the wafer in the fifth embodiment.

In this manner, SC2 is supplied to the metal adhesion prevention area 70, and a metal 63, which adhered to the metal adhesion prevention area 70 by the developing process, is removed together with the SC2 from the wafer W (FIG. 42). After the discharging of SC2 from the lower SC2 nozzle 111 and the upper SC2 nozzle 114 has been stopped, SPM is discharged from the lower SPM nozzle 112 and the upper SPM nozzle 115. Similar to the SC2, the SPM is supplied to the metal adhesion prevention area 70 so as to remove the metal 63 adhering to the metal adhesion prevention area 70.

After the discharging of SPM from the lower SPM nozzle 112 and the upper SPM nozzle 115 has been stopped, deionized water is discharged from the lower deionized water nozzle 113 and the upper deionized water nozzle 116. Similarly to the SC2 and the SPM, the deionized water is supplied to the metal adhesion prevention area 70 so as to remove the SC2 and the SPM remaining in the metal adhesion prevention area 70. After that, the discharging of the deionized water from the lower deionized water nozzle 113 and the upper deionized water nozzle 116 is stopped, the rotation of the wafer W is stopped, and the wafer W is unloaded from the developing module 2. In the fifth embodiment, since the metal 63 adhering to the metal adhesion prevention area 70 of the wafer W is removed by supplying SC2 and SPM, which are metal removal liquids, to the metal adhesion prevention area 70, adhesion of the metal 63 to the metal adhesion prevention area 70 of the wafer W to be unloaded from the developing module 2 can be prevented.

In order to more reliably prevent adhesion of the metal to the transfer mechanism 11, the above-described metal adhesion prevention area 70 is set to include the bevel on the front side and the area slightly nearer to the central side than the bevel. However, as long as adhesion of the metal at least to the circumferential side surface of the wafer W, the bevel on the rear side of the wafer W and the peripheral part of the rear surface of the wafer W can be prevented, adhesion of the metal to the transfer mechanism 11 can be prevented. Thus, when the wafer W is cleaned by means of SC2, SPM and deionized water as described above, no liquid may be discharged from the nozzles 114 to 116 disposed above the wafer W. Meanwhile, by adjusting the rotational speed of the wafer W such that the respective liquids discharged from the nozzles 111 to 113 disposed below the wafer W form liquid films extending up to the bevel on the front side through the circumferential side surface of the wafer, so that the wafer W can be cleaned by the liquid films.

Figure 43:
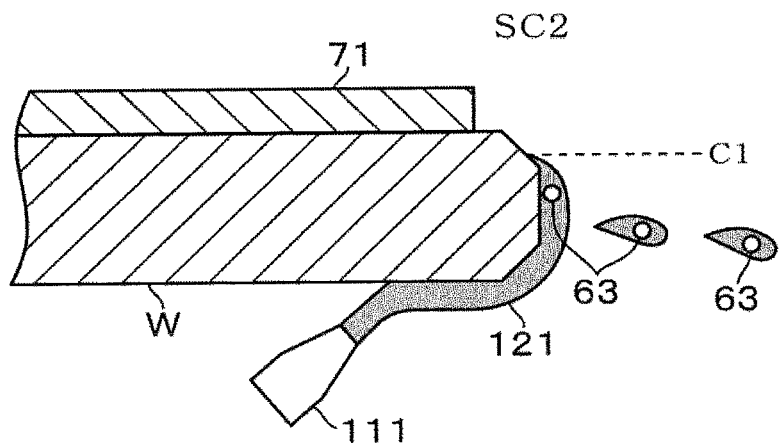
FIG. 43 is a vertical sectional view showing a process step of a wafer in a modified example of the fifth embodiment.
Figure 44:
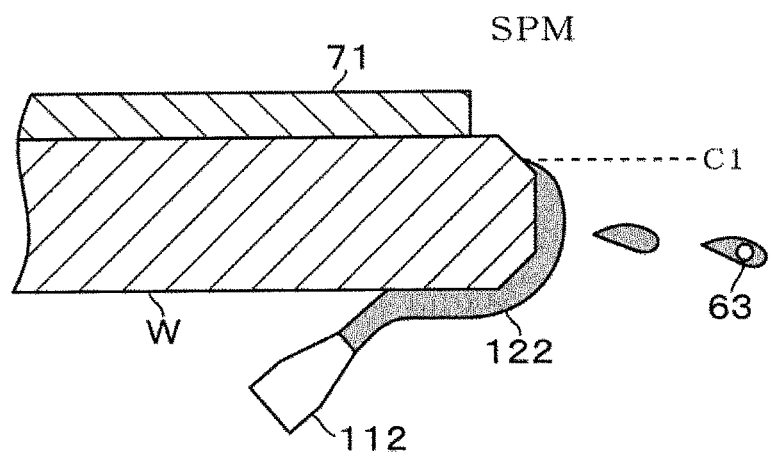
FIG. 44 is a vertical sectional view showing a process step of the wafer in the modified example of the fifth embodiment.
Figure 45:
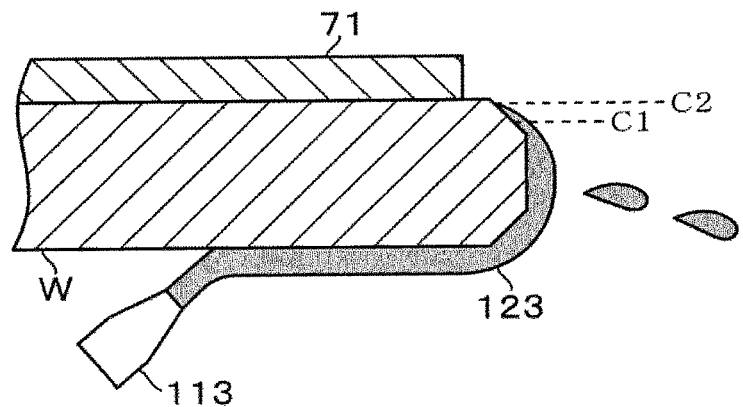
FIG. 45 is a vertical sectional view showing a process step of the wafer in the modified example of the fifth embodiment.

FIGS. 43 and 44 show liquid films 121 and 122 formed by supplying SC2 and SPM from the nozzles 111 and 112. An upper end of an area with which the liquid film 121, 122 is in contact in the bevel on the front side of the wafer W is indicated by C1. FIG. 45 shows a liquid film 123 formed by supplying deionized water from the nozzle 113. An upper end of an area with which the liquid film 123 is in contact, on the bevel on the front side of the wafer W, is indicated by C2. The position C2 is higher than the position C1. Namely, the position C2 is set as a position nearer to the central part of the wafer W. Since the position C1 and the position C2 are determined in this manner, it can be prevented that SC2 or SPM comes into contact with an end part of the resist film 71 to alter the resist film 71. In addition, in the wafer W, since deionized water is supplied to an area, which includes the areas to which SC2 and SPM were supplied, and thus is larger than these areas, SC2 and SPM can be reliably removed from the wafer W. Not limited to SC2 and SPM, hydrofluoric acid may be used as a metal removal liquid.

Sixth Embodiment

In a sixth embodiment, the developing process is performed with the metal adhesion prevention area 70 not being covered with a protective film, similarly to the fifth embodiment. A developing module having substantially the same structure as that of the developing module 2 described in the fifth embodiment is used in the developing process. However, the nozzles 114 and 111 are connected to a supply source of an organic medium that does not dissolve the resist film 71, and discharge the organic medium.

Figure 46:
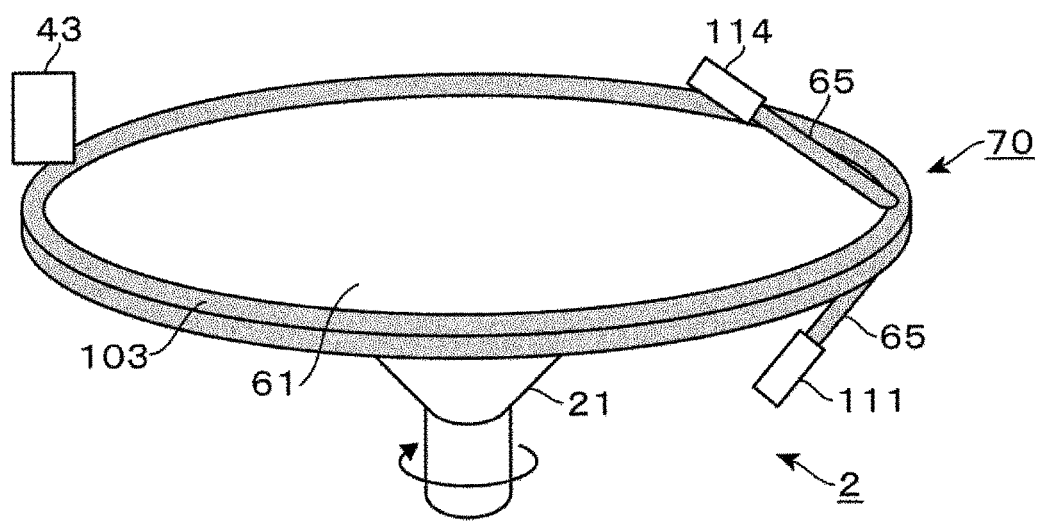
FIG. 46 is a perspective view showing a process step of a wafer in a sixth embodiment of the present invention.
Figure 47:
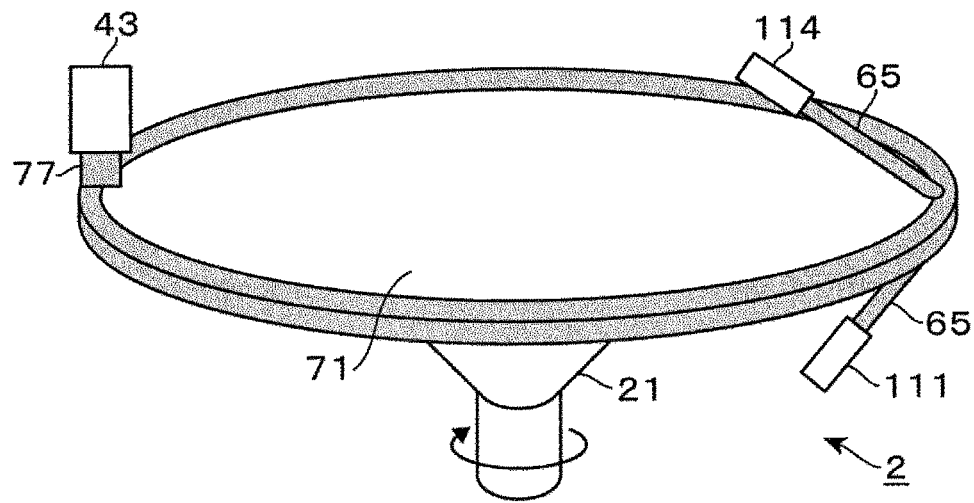
FIG. 47 is a perspective view showing a process step of the wafer.
Figure 48:
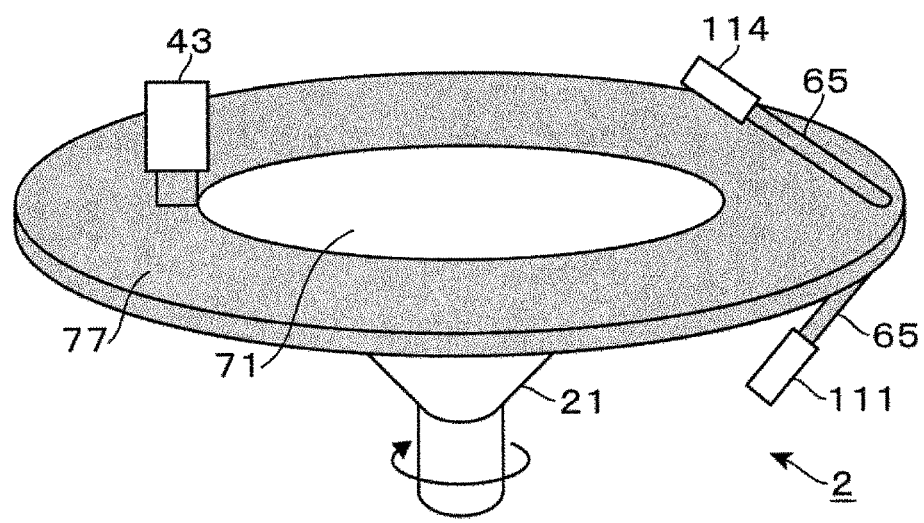
FIG. 48 is a perspective view showing a process step of the wafer.

The process in the developing module 2 is described. An organic medium 65 is supplied to a rotating wafer W from the nozzle 111 and the nozzle 114 that are supply units of a metal adhesion prevention liquid. The organic medium 65 is supplied along the circumference of the wafer W, so that the metal adhesion prevention area 70 is covered with a liquid film of the organic medium 65 (FIG. 46). Thereafter, the developer 77 is discharged from the developer nozzle 43 onto the peripheral portion of the front surface of the wafer W (FIG. 47). Then, the developer nozzle 43 is moved so that a position at which the developer 77 is supplied to the front surface of the wafer W is moved toward the central part of the wafer W (FIG. 48). The developer 77 containing the dissolved resist flows toward the metal adhesion prevention area 70 in the peripheral part of the wafer W. However, since the metal adhesion prevention area 70 has been supplied with the organic medium 65 before the developer 77 is supplied thereto, the developer 77 is diluted by the organic medium 65, and scatters or spills off to be removed from the wafer W. Due to this dilution, the metal contained in the developer 70 is prevented from adhering to the metal adhesion prevention area 70.

Figure 49:
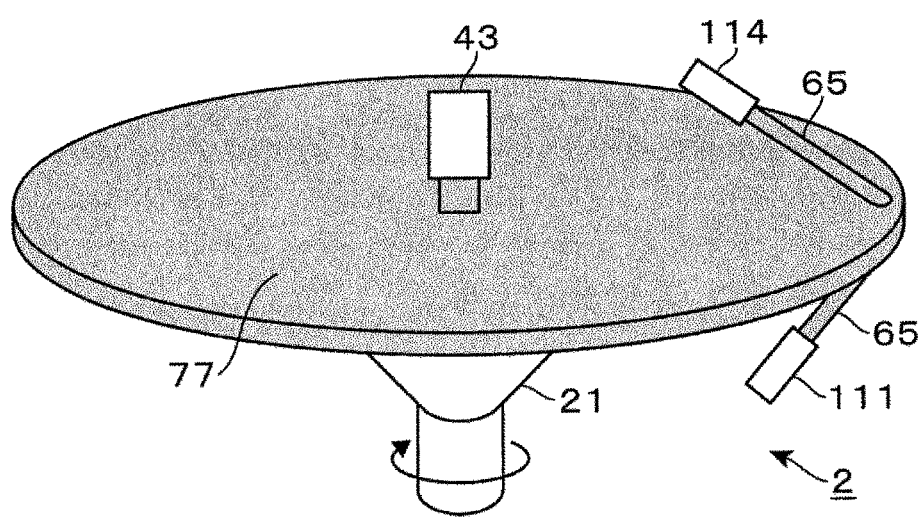
FIG. 49 is a perspective view showing a process step of the wafer.

When the position at which the developer 77 is supplied reaches the central part of the wafer W, the movement of the developer nozzle 43 is stopped (FIG. 49). After that, the discharging of the developer 77 from the developer nozzle 43 is stopped, and the developer 77 is spun off to be removed from the wafer W. Thereafter, the discharging of the organic medium 65 from the nozzle 111 and the nozzle 114 is stopped, and the formation of the liquid film by the organic medium 65 is stopped. After the organic medium 65 has been spun off to be removed from the wafer W, the rotation of the wafer W is stopped. Thereafter, the wafer W is unloaded from the developing module 2.

According to the sixth embodiment, as described above, the organic medium 65 is supplied to the metal adhesion prevention area 70, during a time period from before the developer is started to be supplied to the metal adhesion prevention area 70 of the wafer W until the developer is removed from the wafer W. Thus, it can be prevented that the metal adheres to the metal adhesion prevention area 70 during the developing process. It is sufficient that, before the developer 77 supplied to the wafer W arrives at the metal adhesion prevention area 70, the organic medium 65 has been supplied to the portion of the metal adhesion prevention area 70 at which the developer 77 arrives so as to dilute the developer 77. Thus, immediately after the start of supply of the developer 77, when the developer 77 arrives at the metal adhesion prevention area 70, the liquid film by the organic medium 65 may not be formed over all the circumference of the wafer W, but the liquid film may be formed only on a portion at which the developer 77 arrived in the peripheral part of the wafer W.

In the sixth embodiment, the developer 77 may be supplied to the central part of the wafer W before it is supplied to the peripheral part of the wafer W. However, in such a process, since the developer 77 extends toward the peripheral part of the wafer W while it is dissolving the resist, a metal concentration in a mixed liquid of the developer 77 and the organic medium 65 on the metal adhesion prevention area 70 becomes relatively high, whereby the metal tends to adhere to the metal adhesion prevention area 70. In the process described with reference to FIGS. 46 to 49, since the position at which the developer 77 is supplied is moved from the peripheral part to the central part of the wafer W, the resist film 71 gradually dissolves from the peripheral side toward the central side, whereby the metal concentration of the mixed liquid on the metal adhesion prevention area 70 can be made low. Thus, adhesion of the metal to the metal adhesion prevention area 70 can be more reliably prevented. Any liquid that can dilute the developer in which the resist is dissolved can be used as the metal adhesion prevention liquid. For example, a developer may be used in addition to the organic medium 65.

Seventh Embodiment

Figure 50:
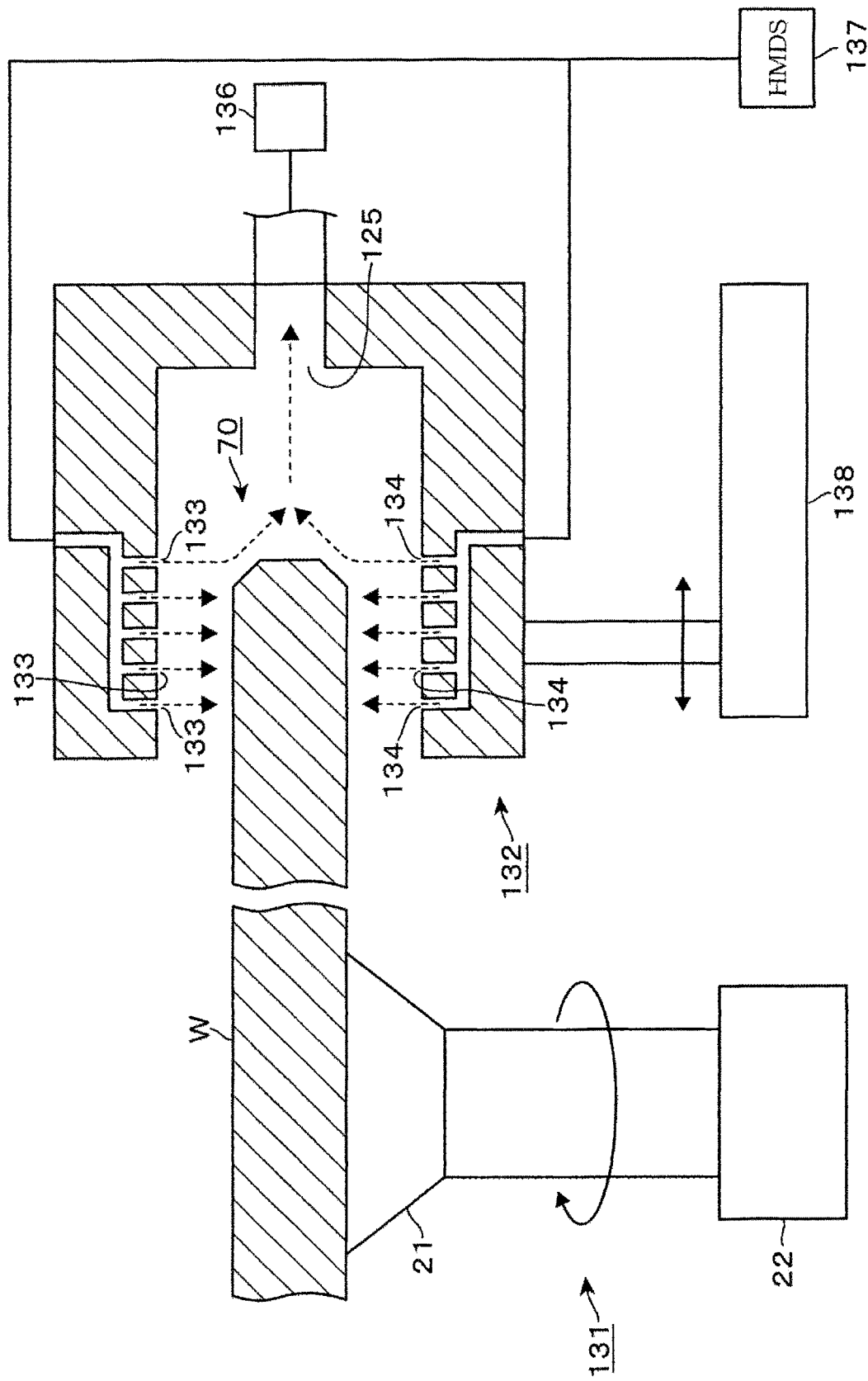
FIG. 50 is a side view of a protective film forming module used in a seventh embodiment of the present invention.

FIG. 50 shows a protective film forming module 131 that forms a protective film employing a gas process. The protective film forming module 131 differs from the protective-film forming module 13 in that the protective-film forming module 131 has a processing unit 132 that has a lateral U-shape in a side view. The processing unit 132 is opened toward the central part of the wafer W so as to surround the peripheral part of the wafer W placed on the spin chuck 21. The reference numerals 133 and 134 depict gas discharge ports formed in an upper part and a lower part of the processing unit 132 so as to respectively open toward the front surface and the rear surface of the wafer W. The reference numeral 135 depicts an exhaust port formed in the processing unit 132 so as to be opposed to the circumferential side surface of the wafer W. The reference numeral 136 depicts an exhaust mechanism connected to the exhaust port 135. A hydrophobizing-gas supply source, which stores a hydrophobizing gas for hydrophobizing the surface of the wafer W and supplies the hydrophobizing gas to the gas discharge ports 133 and 134, is connected to the gas discharge ports 133 and 134. The hydrophobizing gas is HMDS (hexamethylene disilane) gas, for example. The reference numeral 138 depicts a drive mechanism that moves the processing unit 132 along the opening direction of the lateral U-shape, while avoiding that transferring of the wafer W to and from the spin chuck 21 is disturbed.

The rotation of the wafer W, the discharging of the hydrophobizing gas from the gas discharge ports 133 and 134, and the evacuation through the exhaust port 125 are simultaneously performed, and the metal adhesion prevention area 70 is subjected to the HMDS gas. The dotted-line arrows in the drawings show the gas flow. A hydroxyl group present in the surface of the metal adhesion prevention area 70 becomes—O—Si(CH$_3$)$_3$, i.e., a silyl group by the HMDS gas. As compared with the hydroxyl group, the silyl group is unlikely to combine with the metal contained in the resist. Namely, a protective film made of the silyl group is formed on the surface of the wafer W by means of the hydrophobizing process.

In the seventh embodiment, the protective film forming module 131, instead of the protective film forming module 13, forms a protective film. After the formation of the protective film, the wafer W is transferred to the respective modules and is subjected to processes, as described in the first embodiment. The protective film made of a silyl group is very thin, as compared with the protective film 72 that is formed by drying a liquid film of the chemical liquid 73 in the protective film forming module 13 of the respective aforementioned embodiments. Thus, in the seventh embodiment, the protective film made of a silyl group is not removed. Namely, the wafer W having the protective film formed thereon is transferred to the respective modules and is returned to the carrier 18. Thus, in the developing module 2, it is not necessary to form the protective film 72.

The protective film forming module for forming the protective film by means of a hydrophobizing gas is not limited to the above structural example. For example, another protective film forming module includes a processing vessel, a gas showerhead disposed on a ceiling of the processing vessel and configured to discharge a hydrophobizing gas toward the whole front surface of a wafer W, and a stage that supports a central portion of the wafer W. The peripheral portion of the rear surface of the wafer W and the circumferential side surface of the wafer W are processed with the hydrophobizing gas coming from the front surface. After the process by means of the hydrophobizing gas, formation of a resist film and removal of an unnecessary portion of the resist film are performed in the resist film forming module 17. Thus, the present invention is not limited to an embodiment in which a protective film is locally formed on the peripheral part of the wafer W.

An organic matter may sometimes adhere to the front surface of the wafer W. By removing the organic matter, the front surface of the wafer W can be more reliably made hydrophobic by the hydrophobizing gas. Thus, the coating and developing module 1 may be equipped with a UV irradiation module that irradiates the front surface of the wafer W with UV (ultraviolet light). In this case, after the wafer W has been processed by the UV irradiation module, the wafer W is transferred to the protective film forming module 131 and is then processed. The UV irradiation module and the protective film forming module 131 are provided in the tower T1 or the shelf unit U in the coating and developing apparatus described with reference to FIG. 26, for example. Alternatively, a protective film may be formed by supplying HMDS in a liquid state to the wafer W and by drying the HMDS.

(Modified Example of Resist Film Forming Module)

Figure 51:
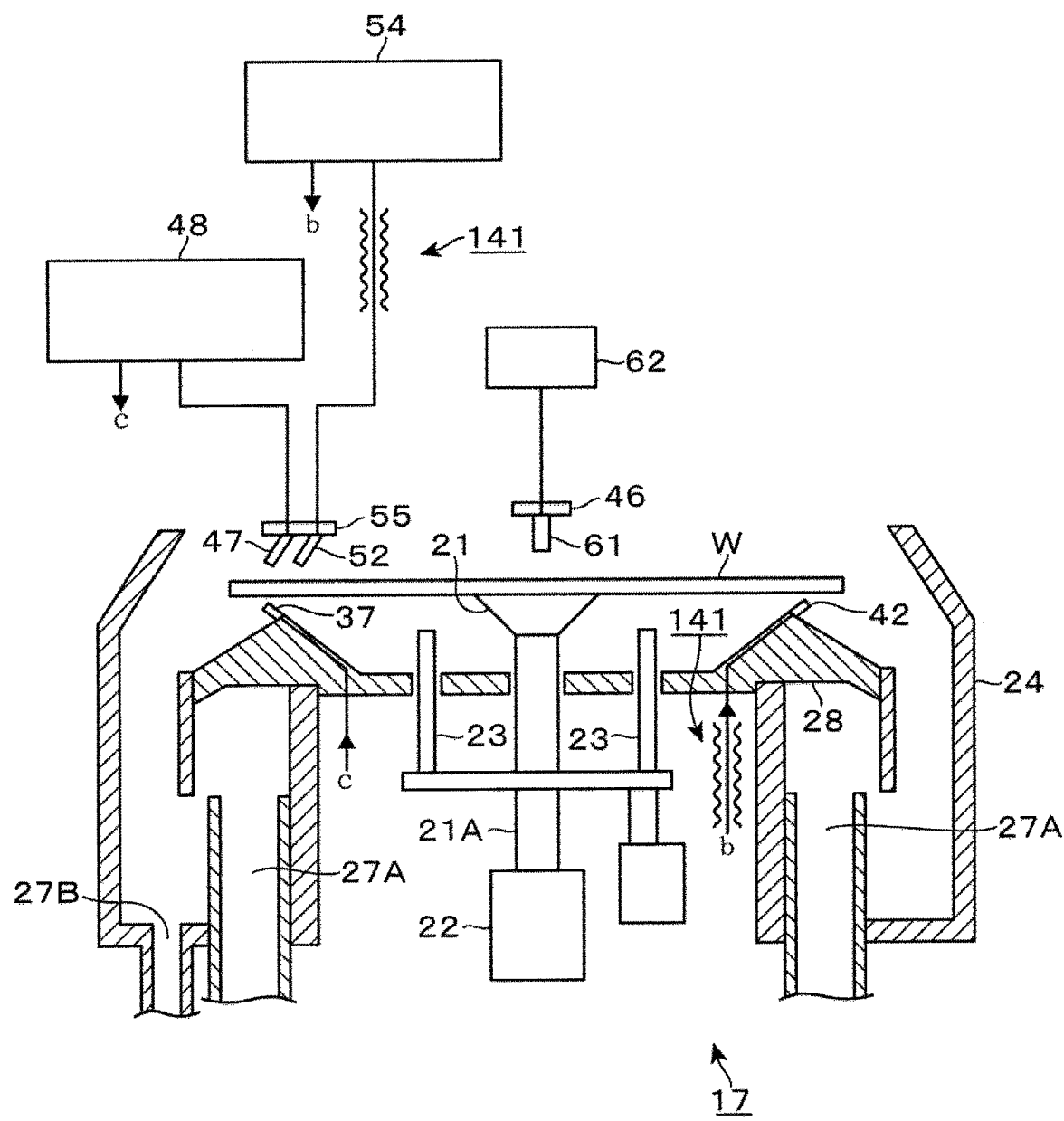
FIG. 51 is a vertical sectional view showing a modified example of the resist-film forming module.

FIG. 51 shows a modified example of the resist film forming module 17. The resist film forming module 17 includes a supply source 54 of a protective film removing solvent, and a heater 141 that heats a flow channel connecting an upper solvent nozzle 52 for protective film removal and a lower solvent nozzle 42 for protective film removal. A solvent 76 is heated while it circulates in the flow channel, and the solvent 76 having a higher temperature than that of an atmosphere in the cup 24 is discharged from the upper solvent nozzle 52 for protective film removal and the lower solvent nozzle 42 for protective film removal. Since the heated solvent 76 is supplied, the removal of the protective film 72 can be promptly performed, a throughput of the coating and developing apparatus 1 can be improved. The modified example is not limited to the structure in which the solvent 76 circulating in the flow channel is heated. A heater may be provided on a tank storing the solvent, which constitutes a solvent supply source 54, and the solvent 76 stored in the supply source 54 may be heated.

Figure 52:
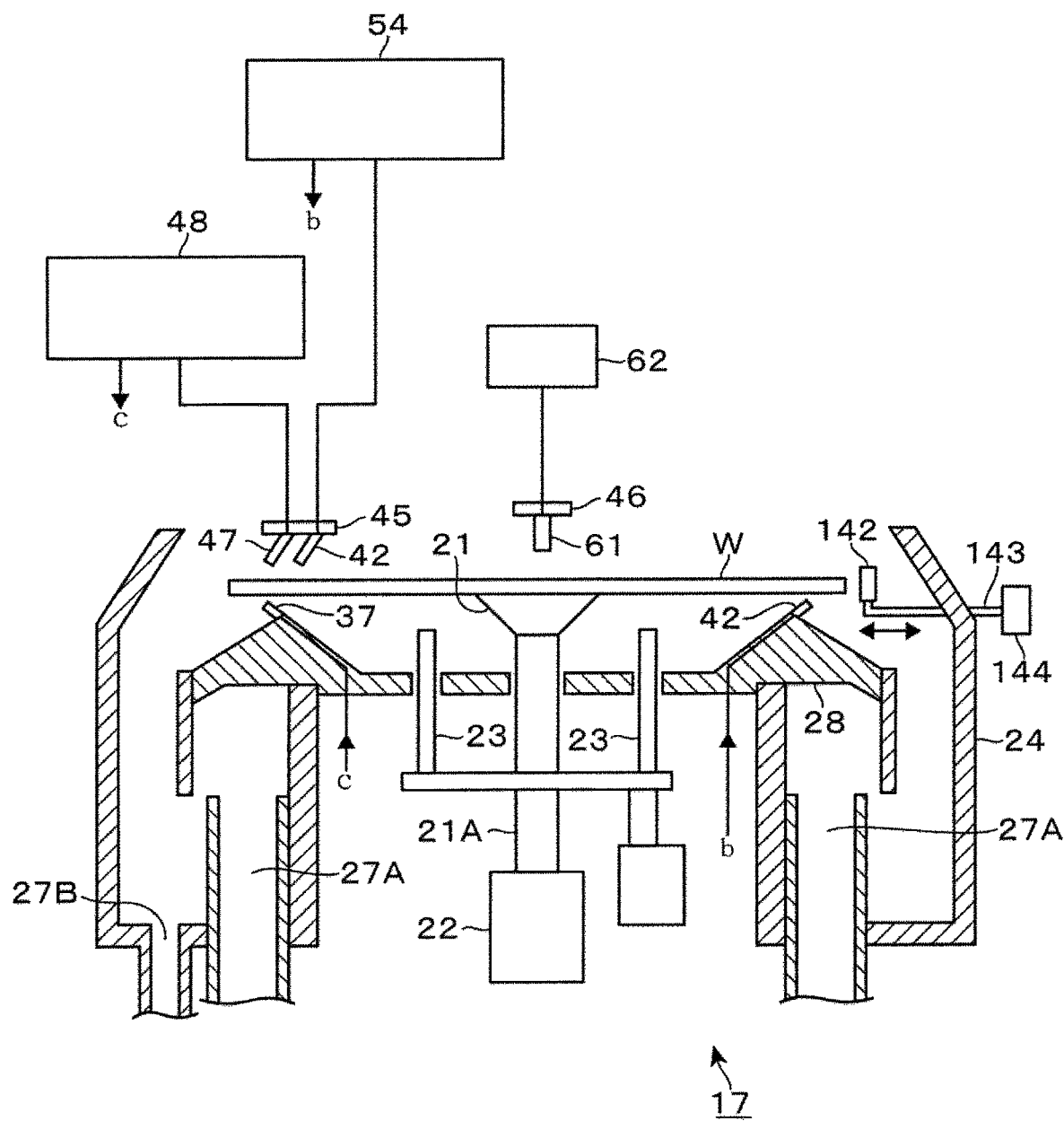
FIG. 52 is a vertical sectional view showing a modified example of the resist film forming module.

FIG. 52 shows another modified example of the resist film forming module 17. A brush 142 for removing the protective film 72 is disposed in the cup 24 of the resist film forming module 17. The brush 142, which is a protective film removing unit, is connected to a drive mechanism 134 located outside the cup 24 through a connection unit 143 passing through the sidewall of the cup 24, for example. The brush 142 can be moved by the drive mechanism 144 along an extension line of the diameter of the wafer W placed on the spin chuck 21.

Figure 53:
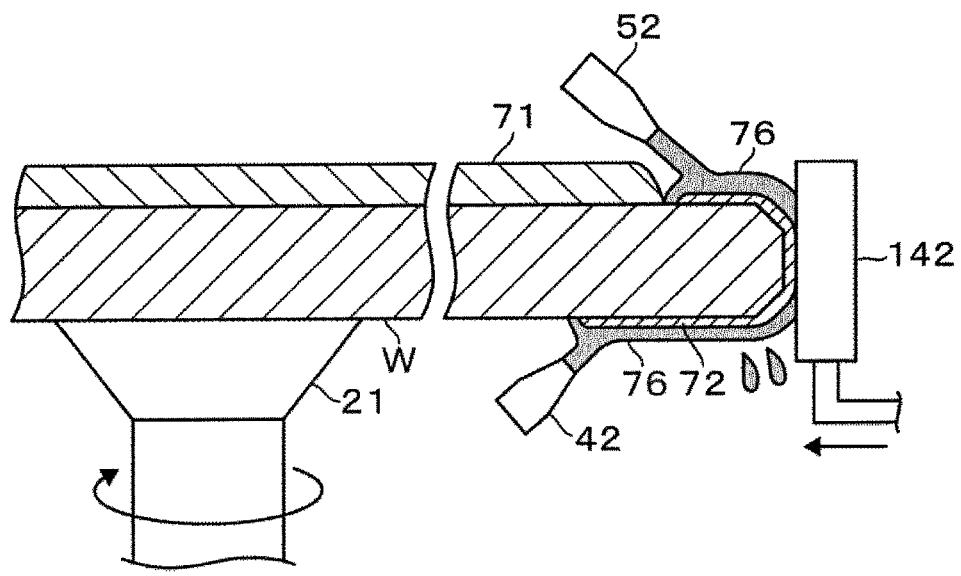
FIG. 53 is a vertical sectional view of a wafer from which a protective film is to be removed.

In the resist film forming module 17 shown in FIG. 52, when the solvent 76 is discharged from the lower solvent nozzle 42 for protective film removal and the upper solvent nozzle 52 for protective film removal, the brush 142 is urged against the circumferential side surface of the rotating wafer W so as to rub the protective film 72 (FIG. 53). When the removal of the protective film 72 is not performed, the brush 142 is located near the sidewall of the cup 24, in order not to disturb the formation of the resist film 71 and the transferring of the wafer W to the spin chuck 21. Since the supply of the solvent from the nozzles 42 and 52 and the rubbing by the brush 142 are simultaneously performed, the protective film 72 can be promptly removed. The brush 142 and the heater 141 shown in FIGS. 51 and 52 can be applied to the respective above-described embodiments. Not limited to the resist film forming module 17, the brush 142 and the heater 141 can be provided in the developing module 2.
(Modified Example of First Embodiment)

Figure 54:
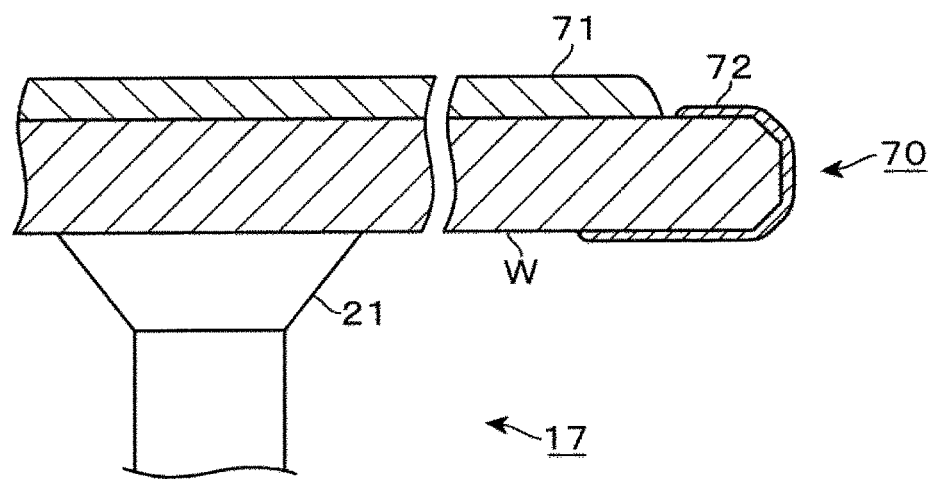
FIG. 54 is a vertical sectional view of the wafer in which the protective film is formed.

Next, a first modified example of the process in the first embodiment is described. After the formation of the resist film 71 and the removal of the unnecessary resist film 71 shown in FIGS. 18 and 19 are preformed in the resist film forming module 17, the solvent 76 is discharged onto the protective film 72 from the lower solvent nozzle 42 for protective film removal and the upper solvent nozzle 52 for protective film removal. At this time, the discharging of the solvent 76 is stopped such that only a surface part (upper part) of the protective film 72 is removed, while a lower lamination side of the protective film 72 remains on the wafer W. Namely, the metal adhesion prevention area 70 is still covered with the thinned protective film 72 (FIG. 54). When the wafer W is loaded into the exposure apparatus 12, since the protective film 72 has been made thinner, it can be prevented that a position of the wafer W to be exposed is displaced from the correct position. The developing module 2 does not newly form the protective film 72, and performs the developing process with the use of the remaining protective film 72. After the developing process, the protective film 72 is removed similarly to the first embodiment.

Figure 55:
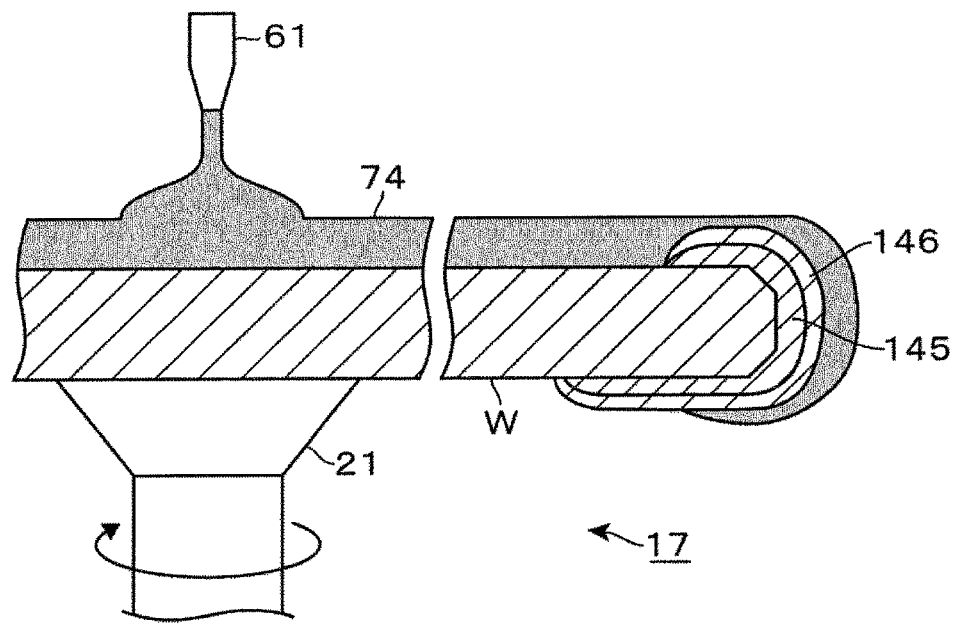
FIG. 55 is a vertical sectional view of the wafer in which the protective film is formed.

Further, a second modified example of the first embodiment is described. The protective film forming module 13 is equipped with two pairs of the upper chemical nozzle 51 for protective film formation and the lower chemical nozzle 41 for protective film formation. The respective pairs of nozzles are configured to discharge chemical liquids of different kinds. Firstly, a chemical liquid is discharged from one pair to the wafer W to form a protective film (referred to as "lower lamination protective film 145" for the sake of convenience) similar to the protective film 72. Thereafter, another chemical liquid is discharged from the other pair onto the wafer W to form a protective film (upper lamination protective film 146) laminated on the lower lamination protective film 145. The resist 74 is applied, with the lower lamination protective film 145 and the upper lamination protective film 146 being formed (FIG. 55), and the unnecessary resist film 71 on the peripheral part of the wafer W is subsequently removed.

Figure 56:
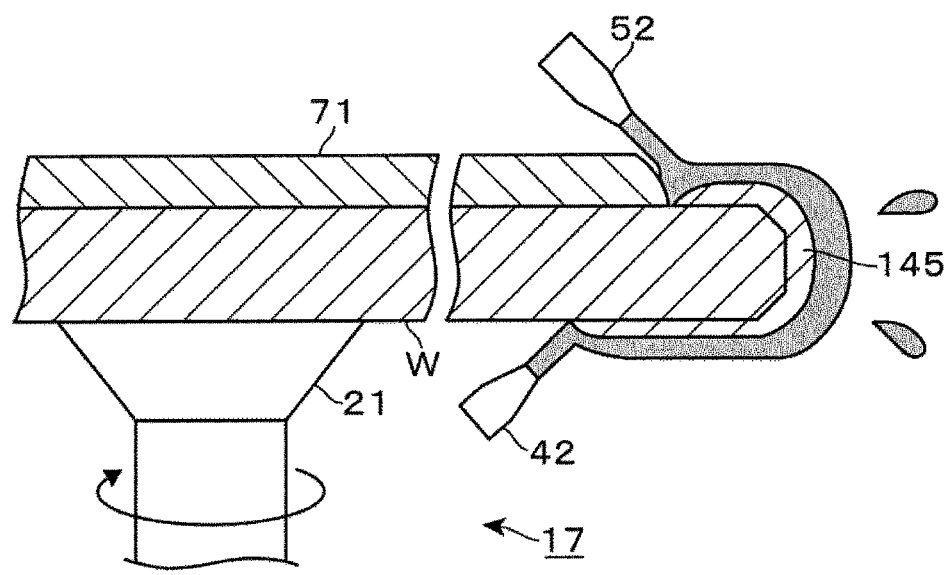
FIG. 56 is a vertical sectional view of the wafer in which the protective film is formed.

Thereafter, the solvent 76 is discharged onto the upper lamination protective film 146 from the lower solvent nozzle 42 for protective film removal and the upper solvent nozzle 52 for protective film removal (FIG. 56). For example, a solvent, which is capable of selectively dissolving only the upper lamination protective film 146 out of the upper lamination protective film 146 and the lower lamination protective film 145, is used as the solvent 76. Thereafter, similarly to the first embodiment, the wafer W is transferred and processed. In the developing module 2, no protective film is formed, and the development is performed by using the lower lamination protective film 145. After the development, the lower lamination protective film 145 is removed. Also in the second modified example, when the wafer W is loaded into the exposure apparatus 12, the protective film 72 has been made thinner. Thus, it can be prevented that a position to be exposed is displaced from the correct position.

As described above, since it is sufficient to prevent metal from adhering to at least the circumferential side surface of the wafer W, the bevel on the rear side of the wafer W and the peripheral part of the rear surface of the wafer W, the protective film 72 may be formed to cover only these areas. Thus, the protective film 72 may be formed as follows. Namely, the chemical liquid 73 is discharged only from the lower chemical nozzle 41 for protective film formation, while no chemical liquid is discharged from the chemical nozzle 51 for protective film formation. A liquid film of the chemical liquid 73 is formed to extend from the peripheral portion of the rear surface of the rotating wafer W to the circumferential side surface. The liquid film is dried to form the protective film 72.

In addition, before the resist film 71 is formed, the protective film 72 may not be formed. For example, the resist is applied to the wafer W by moving the resist nozzle 61 discharging the resist, without rotating the wafer W. By moving the resist nozzle 61 such that the resist 74 is not supplied to the metal adhesion prevention area 70, it is not necessary to form the protective film 72. Further, the developing process is not limited to the structure in which the aforementioned developer nozzle 43 is used. For example, a liquid film made of a developer may be formed on the front surface of the wafer W, by moving a nozzle, which has an elongated discharge port covering the diameter of the wafer W, from one end to the other end above the front surface of the stationary (non-rotating) wafer W, while the nozzle discharging the developer. The respective aforementioned embodiments can be combined with each other and/or suitably changed. For example, after a protective film is formed by supplying a hydrophobizing gas onto the peripheral part of the wafer W, the chemical liquid 73 is further supplied so as to form the protective film 72.

The invention claimed is:
1. A coating and developing apparatus comprising:
   a control unit configured to control a resist film forming module, a developing module and a protective film forming module;
   the resist film forming module configured to apply a resist containing a metal to a front surface of a substrate to form a resist film;
   the developing module configured to supply a developer to the front surface of the substrate to develop the resist film having been exposed by an exposure apparatus connected to the coating and developing apparatus; and the protective film forming module configured to form a protective film, after exposure and before development of the resist film, on a peripheral part of the substrate on which the resist film is not formed, wherein the protective film prevents the developer from coming into contact with the peripheral part of the substrate, and wherein the protective film is formed at least on a peripheral end surface and a peripheral portion of a rear surface of the substrate in the peripheral part of the substrate.

2. A coating and developing apparatus comprising:

a control unit configured to control a resist film forming module, a developing module and an adhesion prevention liquid supplying unit;

the resist film forming module configured to apply a resist containing a metal to a front surface of a substrate to form a resist film;

the developing module configured to supply a developer to the front surface of the substrate to develop the resist film having been exposed by an exposure apparatus connected to the coating and developing apparatus; and the adhesion prevention liquid supplying unit configured to supply, after exposure of the resist film and during a time period from before the developer is supplied to the peripheral part of the substrate until the developer is removed from the front surface of the substrate, an adhesion prevention liquid for preventing adhesion of the metal along a circumference of the substrate to a peripheral part of the substrate on which the resist film is not formed, wherein the adhesion prevention liquid is supplied at least on a peripheral end surface and a peripheral portion of a rear surface of the substrate in the peripheral part of the substrate.

* * * * *